(12) United States Patent
Lee et al.

(10) Patent No.: US 10,795,525 B2
(45) Date of Patent: Oct. 6, 2020

(54) PRESSURE SENSING ELEMENT AND DISPLAY DEVICE HAVING THE SAME

(71) Applicant: Samsung Display Co., Ltd., Yongin-Si, Gyeonggi-Do (KR)

(72) Inventors: Choonhyop Lee, Anyang-si (KR); Kangwon Lee, Seoul (KR); Sangchul Lee, Yongin-si (KR); Seunghwan Chung, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/540,909

(22) Filed: Aug. 14, 2019

(65) Prior Publication Data

US 2020/0174623 A1 Jun. 4, 2020

(30) Foreign Application Priority Data

Nov. 30, 2018 (KR) .......................... 10-2018-0152472

(51) Int. Cl.
 *G06F 3/041* (2006.01)
 *G06F 3/044* (2006.01)
 *H01L 27/32* (2006.01)

(52) U.S. Cl.
 CPC .......... *G06F 3/0446* (2019.05); *G06F 3/0414* (2013.01); *H01L 27/3244* (2013.01)

(58) Field of Classification Search
 CPC .... G06F 3/0446; G06F 3/0447; G06F 3/0414; G06F 3/044; G06F 3/0416; G06F 3/04144; G06F 2203/04105
 See application file for complete search history.

(56) References Cited

U.S. PATENT DOCUMENTS

| | | | |
|---|---|---|---|
| 8,698,777 B2 | 4/2014 | Endo et al. | |
| 2017/0068368 A1* | 3/2017 | Hsiao | G06F 3/044 |
| 2018/0095582 A1 | 4/2018 | Hwang et al. | |
| 2018/0143718 A1* | 5/2018 | Kim | G06F 3/0412 |
| 2018/0188874 A1 | 7/2018 | Cho et al. | |
| 2018/0210600 A1 | 7/2018 | Lee et al. | |
| 2019/0050077 A1* | 2/2019 | Yu | G06F 3/044 |

FOREIGN PATENT DOCUMENTS

| | | |
|---|---|---|
| KR | 10-2016-0150070 A | 12/2016 |
| KR | 10-2018-0010952 A | 1/2018 |
| KR | 10-2018-0021590 A | 3/2018 |
| KR | 10-2018-0036469 A | 4/2018 |
| KR | 10-2018-0087527 A | 8/2018 |

* cited by examiner

*Primary Examiner* — Dennis P Joseph
(74) *Attorney, Agent, or Firm* — Innovation Counsel LLP

(57) ABSTRACT

A display device includes a pressure sensing element. The pressure sensing element senses a pressure input applied thereto from the outside, and the display device is controlled based on the sensed pressure input. The pressure sensing element includes a contact sensing area to sense the pressure input and a defect sensing area to sense a defect. The pressure sensing element measures a resistance value in the defect sensing area and identifies whether at least one of lines of the pressure sensing element is disconnected.

20 Claims, 17 Drawing Sheets

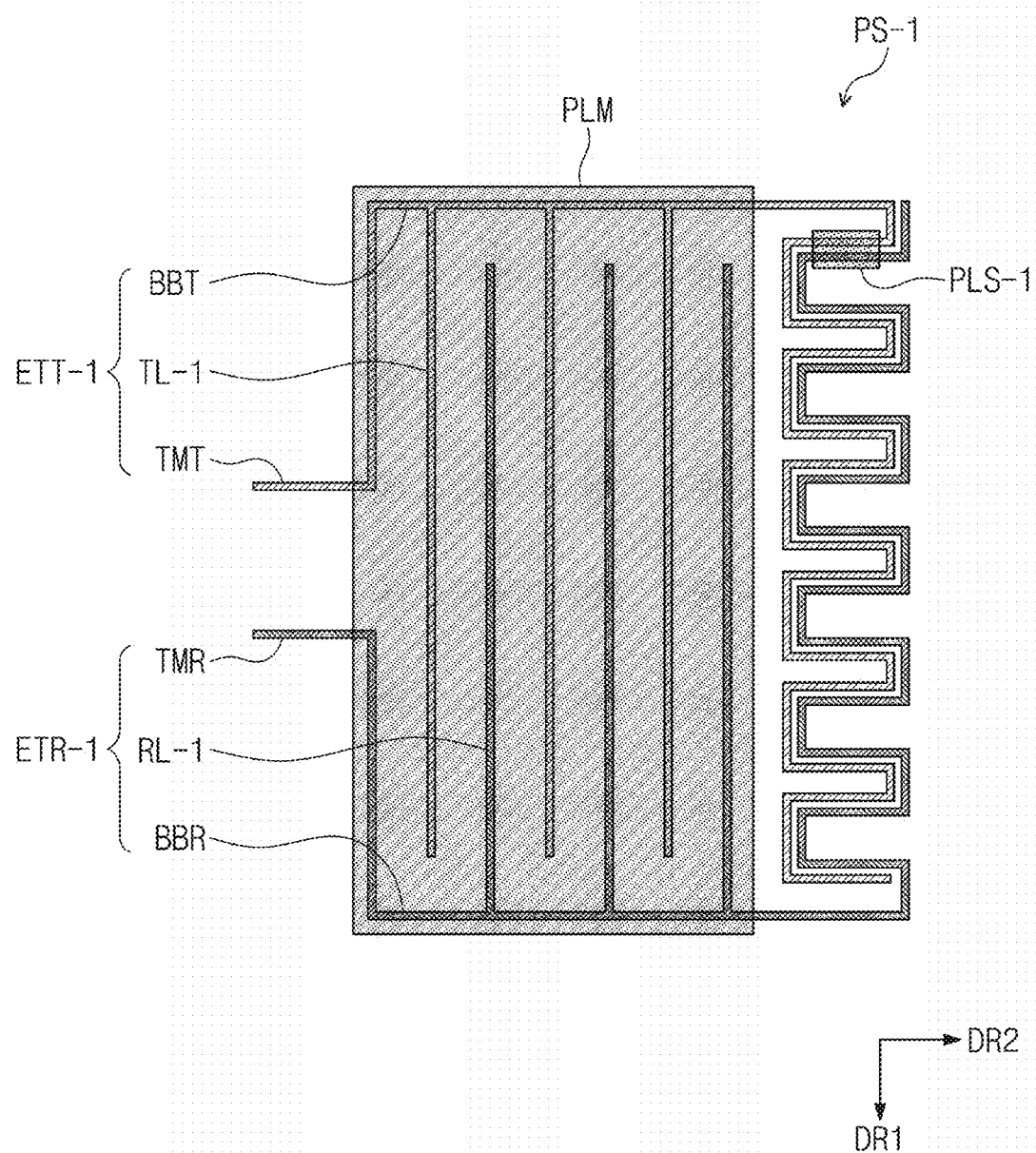

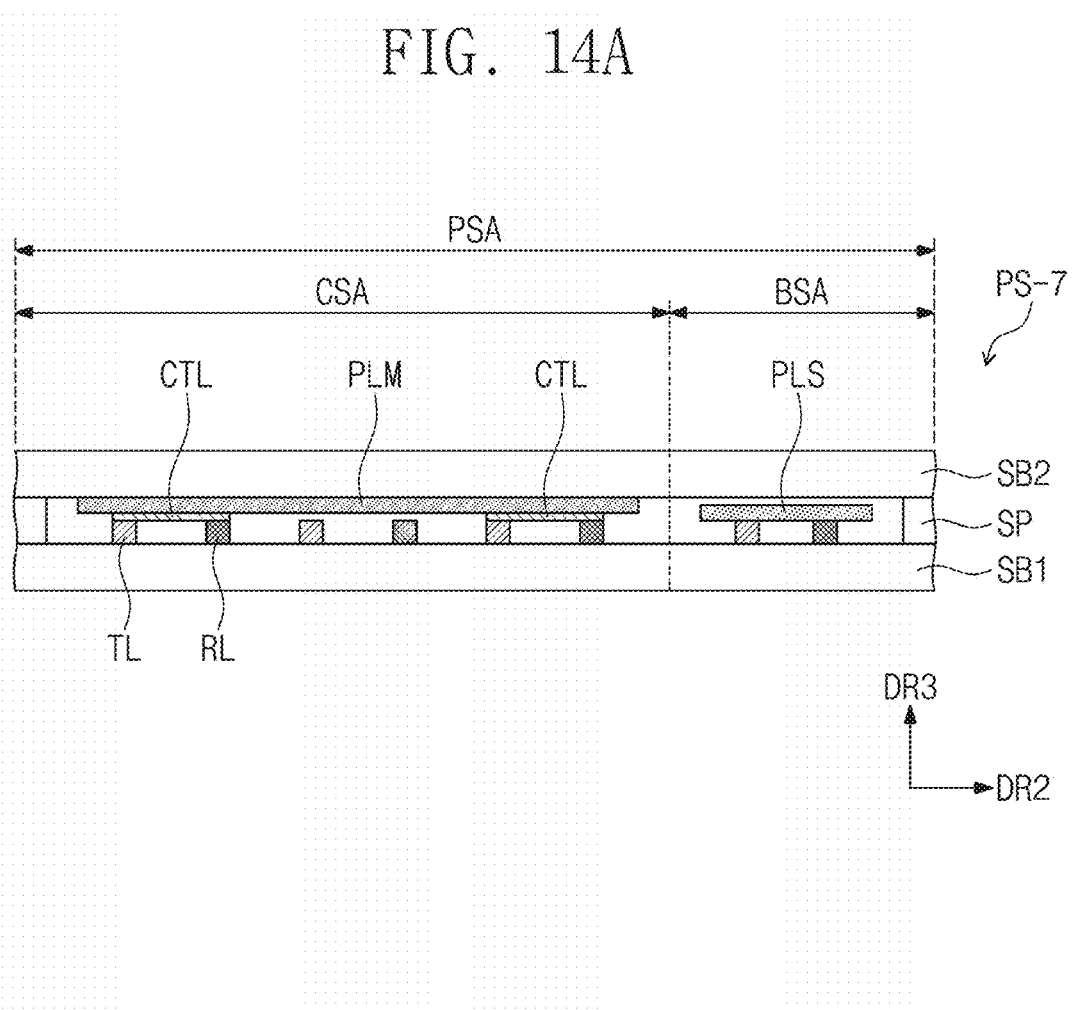

PRESSURE SENSING ELEMENT AND DISPLAY DEVICE HAVING THE SAME

CROSS-REFERENCE TO RELATED APPLICATION

This application claims priority to and the benefit Korean Patent Application No. 10-2018-0152472, filed on Nov. 30, 2018, in the Korean Intellectual Property Office (KIPO), the disclosure of which is incorporated herein by reference in its entirety.

BACKGROUND

1. Field

The present disclosure relates to a pressure sensing element that senses a pressure input applied thereto from an external source and a display device including the pressure sensing element.

2. Description of the Related Art

In today's information society, the importance of a display device as a medium for presenting information in a visual form has been increasing. Currently, various types of display devices such as a liquid crystal display (LCD), a plasma display panel (PDP), an organic light emitting display (OLED), a field effect display (FED), and an electrophoretic display (EPD) are used.

The display device is activated in response to an electrical signal applied thereto. For example, a display device may include an input sensing circuit that senses a touch event applied thereto from the outside of the display device.

Physical buttons may be arranged at an outer portion of the display device to receive a control signal from a user. The user may change a level of sound output from the display device or turns on or off a power source of the display device using at least one of the physical buttons.

SUMMARY

The present disclosure provides a pressure sensing element having a structure that is capable of accurately determining a presence of a defect therein.

The present disclosure provides a display device having the pressure sensing element.

Embodiments of the inventive concept provide a pressure sensing element including a first base, a first transmitting electrode, a first receiving electrode, a first main pressure sensing layer, a first sub-pressure sensing layer, and a second base.

The first transmitting electrode is disposed on the first base and includes a first transmitting terminal and a plurality of first transmitting lines electrically connected to the first transmitting terminal.

The first receiving electrode is disposed on the first base and includes a first receiving terminal and a plurality of first receiving lines alternately arranged with the plurality of first transmitting lines and electrically connected to the first receiving terminal.

The first main pressure sensing layer is disposed on the first transmitting electrode and the first receiving electrode and is spaced apart from the first transmitting electrode and the first receiving electrode by a first set distance.

The first sub-pressure sensing layer is disposed on the first transmitting electrode and the first receiving electrode and makes contact with the first transmitting electrode and the first receiving electrode without overlapping the first main pressure sensing layer when viewed in a plan view.

The second base is disposed on the first main pressure sensing layer and the first sub-pressure sensing layer, makes contact with the first main pressure sensing layer, and is spaced apart from the first sub-pressure sensing layer by a second set distance.

The pressure sensing element may further includes a sealing member that couples the first base and the second base.

A first area of the first main pressure sensing layer is greater than a second area of the first sub-pressure sensing layer.

At least one of the first main pressure sensing layer and the first sub-pressure sensing layer may include a polymer resin and metal particles.

A first number of the plurality of first transmitting lines is equal to a second number of the plurality of first receiving lines.

The first main pressure sensing layer makes contact with at least a portion of the first transmitting electrode and the first receiving electrode when a pressure input is applied from an outside source through the second base.

The first transmitting terminal and the first receiving terminal are disposed adjacent to a first side portion of the first main pressure sensing layer when viewed in the plan view, and the first sub-pressure sensing layer is disposed adjacent to a second side portion of the first main pressure sensing layer when viewed in the plan view.

The pressure sensing element may further include a coating layer. The coating layer is disposed on the first receiving electrode and the first transmitting electrode, is disposed under the first main pressure sensing layer, overlaps portions of the plurality of first transmitting lines and the plurality of first receiving lines. The coating layer may include a hydrophobic material. The hydrophobic material may include at least one of fluorine (F) and silicon (Si). The pressure sensing element further may include a second transmitting electrode, a second receiving electrode, a second main pressure sensing layer, and a second sub-pressure sensing layer.

The second transmitting electrode is disposed on the first base and includes a second transmitting terminal and a plurality of second transmitting lines electrically connected to the second transmitting terminal.

The second receiving electrode is disposed on the first base and includes a second receiving terminal and a plurality of second receiving lines alternately arranged with the plurality of second transmitting lines and electrically connected to the second receiving terminal.

The second main pressure sensing layer is disposed on the second transmitting electrode and the second receiving electrode and is spaced apart from the second transmitting electrode and the second receiving electrode by the first set distance.

The second sub-pressure sensing layer is disposed on the second transmitting electrode and the second receiving electrode and makes contact with the second transmitting electrode and the second receiving electrode without overlapping the second main pressure sensing layer.

The second transmitting terminal and the second receiving terminal are disposed adjacent to the third side portion of the second main pressure sensing layer when viewed in the plan view, and the second sub-pressure sensing layer is disposed adjacent to a fourth side portion of the second main pressure sensing layer when viewed in the plan view.

The second main pressure sensing layer makes contact with the second transmitting electrode and the second receiving electrode when a pressure input is applied from an outside source through the second base.

The pressure sensing element may further include a third transmitting electrode, a third receiving electrode, and a third sub-pressure sensing layer.

The third transmitting electrode may include a third transmitting terminal and a plurality of third transmitting lines electrically connected to the third transmitting terminal, is disposed on the first base, and is disposed between the first transmitting electrode and the second transmitting electrode when viewed in the plan view.

The third receiving electrode may include a third receiving terminal and a plurality of third receiving lines alternately arranged with the plurality of third transmitting lines and electrically connected to the third receiving terminal, is disposed on the first base, and is disposed between the first receiving electrode and the second receiving electrode when viewed in the plan view.

The third sub-pressure sensing layer is disposed on the third transmitting electrode and the third receiving electrode, makes contact with the third transmitting electrode and the third receiving electrode, and is disposed between the first sub-pressure sensing layer and the second sub-pressure sensing layer when viewed in the plan view.

The second main pressure sensing layer is not disposed between the third transmitting electrode and the second base, and between the third receiving electrode and the second base.

The pressure sensing element may further include a plurality of spacers disposed between at least one of adjacent pairs of the plurality of first transmitting lines and the plurality of second transmitting lines and between at least one of adjacent pairs of the plurality of second transmitting lines and the plurality of third transmitting lines.

Embodiments of the inventive concept provide a display device including a display panel including a plurality of light emitting elements, an input sensing circuit including a plurality of sensors disposed on the display panel and capacitively coupled to each other and an input sensing driver electrically connected to the plurality of sensors, a pressure sensing element disposed under the display panel, and a bracket disposed under the pressure sensing element.

The pressure sensing element includes a first base, a transmitting electrode, a receiving electrode, a main pressure sensing layer, a sub-pressure sensing layer, and a second base.

The transmitting electrode is disposed on the first base and includes a transmitting terminal and a plurality of transmitting lines electrically connected to the transmitting terminal.

The receiving electrode is disposed on the first base and includes a receiving terminal and a plurality of receiving lines alternately arranged with the plurality of transmitting lines and electrically connected to the receiving terminal.

The main pressure sensing layer is disposed on the transmitting electrode and the receiving electrode and is spaced apart from the transmitting electrode and the receiving electrode by a first set distance.

The sub-pressure sensing layer is disposed on the transmitting electrode and the receiving electrode and makes contact with the transmitting electrode and the receiving electrode without overlapping the main pressure sensing layer when viewed in a plan view.

The second base is disposed on the main pressure sensing layer and the sub-pressure sensing layer, makes contact with the main pressure sensing layer, and is spaced apart from the sub-pressure sensing layer by a second set distance.

The transmitting terminal and the receiving terminal are electrically connected to the input sensing driver, and the input sensing driver measures a resistance value formed by the transmitting electrode, the receiving electrode, the main pressure sensing layer, and the sub-pressure sensing layer.

At least one of the main pressure sensing layer and the sub-pressure sensing layer may include a polymer resin and metal particles.

The main pressure sensing layer makes contact with the transmitting electrode and the receiving electrode when a pressure is applied from an outside source through the second base.

The transmitting terminal and the receiving terminal may be disposed adjacent to a first side portion of the main pressure sensing layer when viewed in the plan view, and the sub-pressure sensing layer is disposed adjacent to a second side portion of the main pressure sensing layer when viewed in the plan view.

According to the above, the pressure sensing element may have a structure to accurately determine an occurrence of a defect in which at least one of the transmitting lines and the receiving lines is disconnected.

In addition, the pressure sensing element may have strong durability even in high-temperature and high-humidity environments.

Further, since physical buttons that may be typically arranged at an outer portion of the display device may be omitted and replaced with the pressure sensing element, aesthetic characteristics of the display device are improved.

BRIEF DESCRIPTION OF THE DRAWINGS

The above and other advantages of the present disclosure will become readily apparent by reference to the following detailed description when considered in conjunction with the accompanying drawings wherein:

FIGS. 11A and 11B are plan views showing examples of a portion of pressure sensing elements according to an exemplary embodiment of the present disclosure;

FIG. 14A is a cross-sectional view showing a portion of a pressure sensing element according to an exemplary embodiment of the present disclosure.

DETAILED DESCRIPTION

Figure 1:
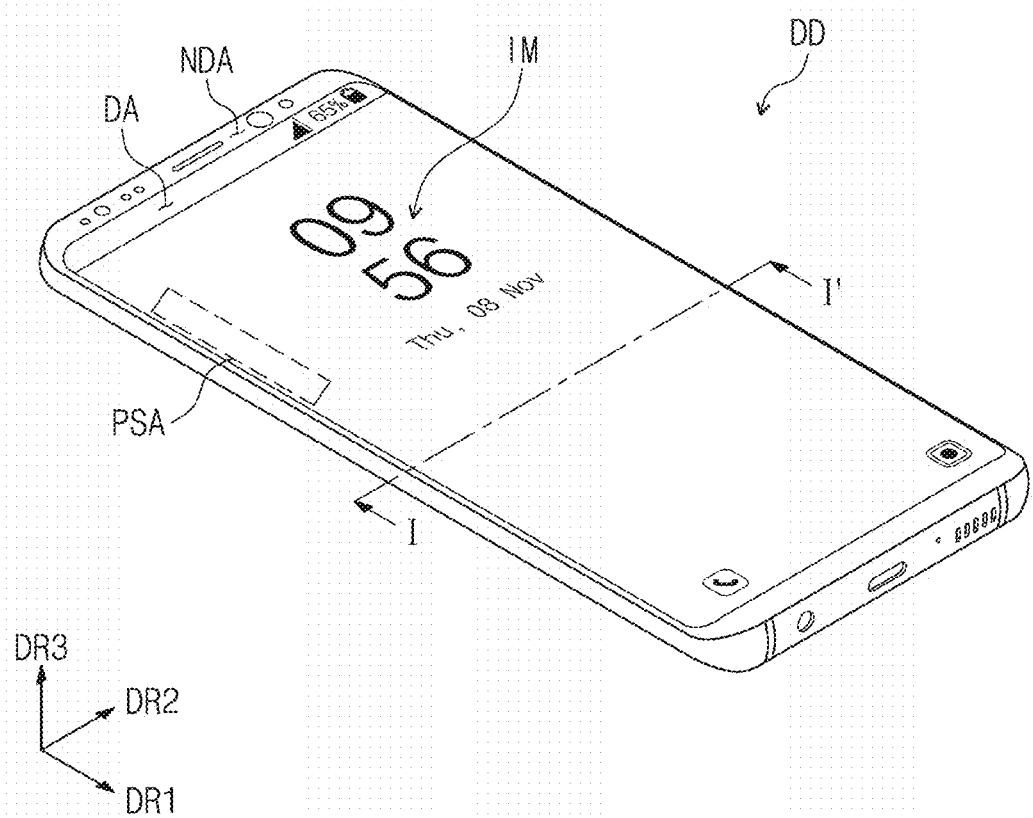
FIG. 1 is a perspective view showing a display device according to an exemplary embodiment of the present disclosure.

Hereinafter, the present disclosure will be explained in detail with reference to the accompanying drawings.

In the drawings, the thickness of layers, films, and regions are exaggerated for clarity. As used herein, the term "and/or" includes any and all combinations of one or more of the associated listed items.

It will be further understood that the terms "includes" and its variants such as "including", etc., when used in this specification, specify the presence of stated features, integers, steps, operations, elements, and/or components, but do not preclude the presence or addition of one or more other features, integers, steps, operations, elements, components, and/or groups thereof.

FIG. 1 is a perspective view showing a display device DD according to an exemplary embodiment of the present disclosure.

FIG. 1 shows a smartphone as an example of the display device DD, however, the display device DD should not be limited to the smartphone. That is, the display device DD may be a large-sized electronic device such as a television set and a monitor, and a small and medium-sized electronic device such as a mobile phone, a tablet computer, a navigation device, a game device, and a smart watch.

The display device DD includes a display area DA through which an image IM is displayed and a non-display area NDA disposed adjacent to the display area DA.

The display area DA may be substantially parallel to a surface of the display device DD that is defined by a first directional axis DR1 and a second directional axis DR2. A third directional axis DR3 indicates a normal direction of the display area DA, i.e., a thickness direction of the display device DD. Front (or upper) and rear (or lower) surfaces of the display device DD are distinguished from each other by the third directional axis DR3. However, directions indicated by the first, second, and third directional axes DR1, DR2, and DR3 may be relative to each other and may be changed to other directions. Hereinafter, first, second, and third directions respectively correspond to directions indicated by the first, second, and third directional axes DR1, DR2, and DR3 and are assigned with the same reference numerals as the first, second, and third directional axes DR1, DR2, and DR3.

A shape of the display area DA shown in FIG. 1 is merely exemplary, and the shape of the display area DA may be changed in various shapes, sizes, and configurations without being limited to the example illustrated in FIG. 1 without deviating from the scope of the present disclosure.

The image IM may not be displayed in the non-display area NDA. For example, the non-display area NDA defines or encompasses at least a portion of a bezel area of the display device DD.

The non-display area NDA may surround the display area DA, however, it should not be limited thereto or thereby. The display area DA and the non-display area NDA may correspond to areas that are relative to each other.

In the exemplary embodiment of the present disclosure, the display area DA may include a pressure sensing area PSA. A user may apply a pressure to the pressure sensing area PSA to adjust a level of sound output from the display device DD. In another exemplary embodiment, the user may apply a pressure to the pressure sensing area PSA to turn on or off a power source of the display device DD.

In the exemplary embodiment of the present disclosure, the pressure sensing area PSA may be disposed adjacent to an edge of the display area DA, however, it should not be limited thereto or thereby. That is, a position of the pressure sensing area PSA may be changed without deviating from the scope of the present disclosure. For example, the pressure sensing area PSA may be disposed in the non-display area NDA or even on a side or a rear surface of the display device DD. In addition, in the exemplary embodiment of the present disclosure, the pressure sensing area PSA may be provided in a plural number.

Figure 2:
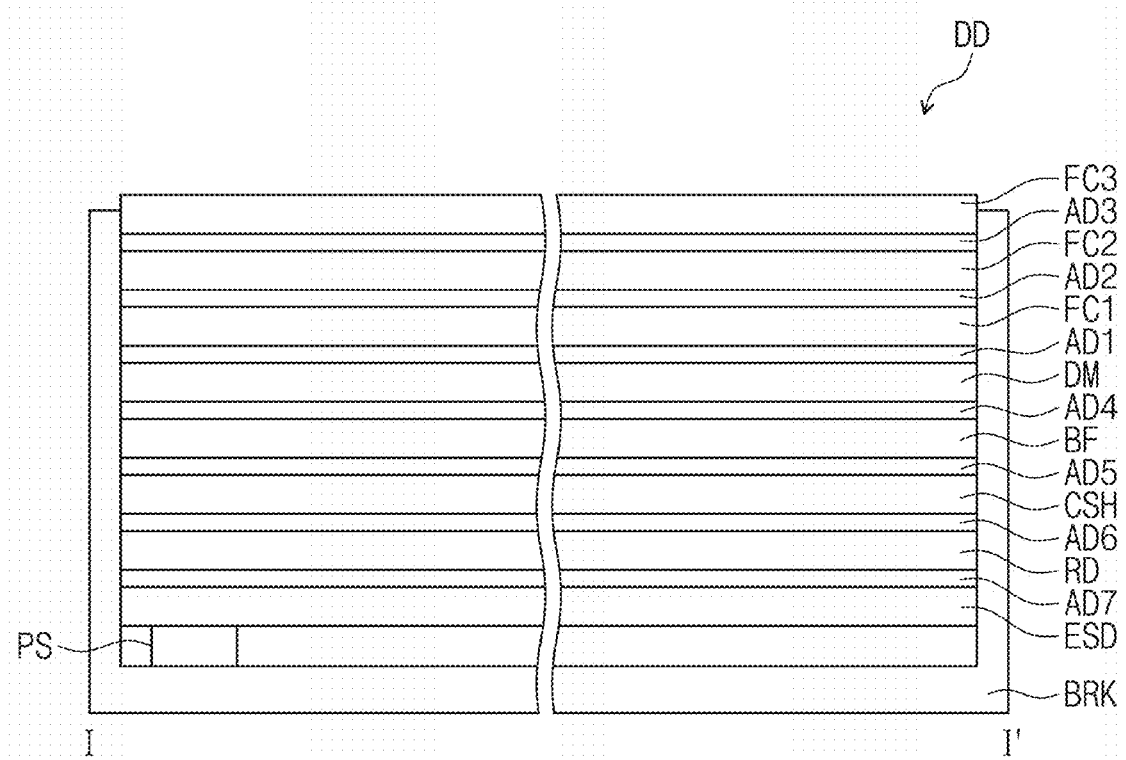
FIG. 2 is a cross-sectional view showing a display device according to an exemplary embodiment of the present disclosure.
Figure 3A:
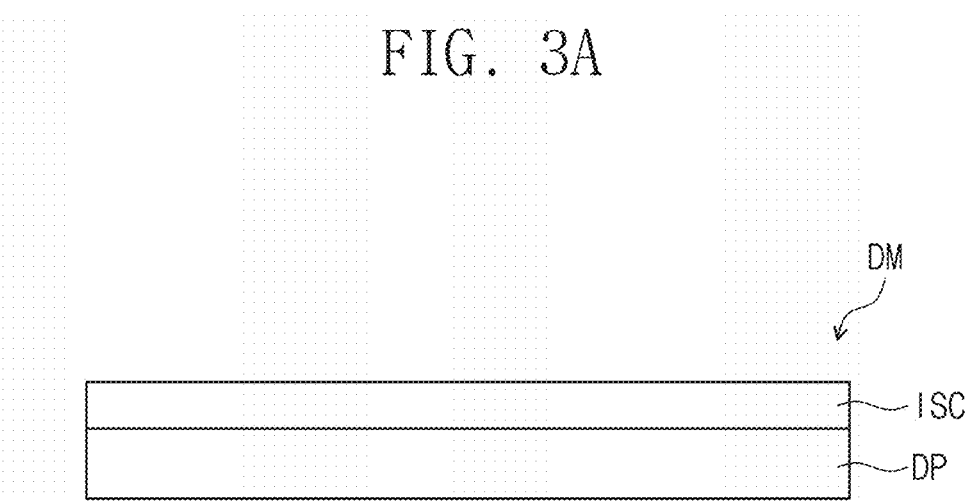
FIGS. 3A and 3B are cross-sectional views showing a display module shown in FIG. 2.
Figure 3A:
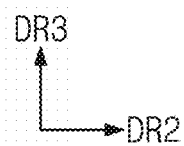
Figure 3B:
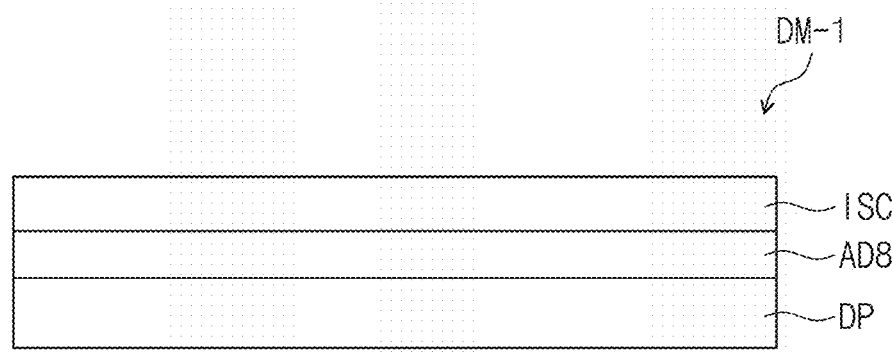
Figure 3B:
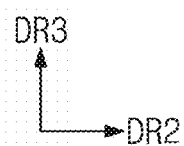

FIG. 2 is a cross-sectional view showing the display device DD according to an exemplary embodiment of the present disclosure. FIGS. 3A and 3B are cross-sectional views showing a display module shown in FIG. 2. FIG. 2 shows a cross-section defined by the second directional axis DR1 and the third directional axis DR3.

The display device DD includes a display module DM, a plurality of functional layers FC1 to FC3, a base film BF, a shock absorbing member CSH, a heat discharging member RD, an electrostatic shielding member ESD, a pressure sensing element PS, a bracket BRK, and a plurality of adhesive members AD1 to AD7.

In the exemplary embodiment of the present disclosure, each of the adhesive members AD1 to AD7 may be a pressure sensitive adhesive. The pressure sensitive adhesive is a type of an adhesive that forms a bond with an adherend when pressure is applied without requiring activation with solvent, water, or heat.

The functional layers FC1 to FC3 are disposed on one side of the display module DM. For example, the functional layers FC1 to FC3 are disposed above the display module DM in FIG. 2.

A first functional layer FC1 is adhered to the display module DM by a first adhesive member AD1. A second functional layer FC2 is adhered to the first functional layer FC1 by a second adhesive member AD2. A third functional layer FC3 is adhered to the second functional layer FC2 by a third adhesive member AD3.

In the exemplary embodiment of the present disclosure, each of the functional layers FC1 to FC3 may include a polymer material or a glass material. Each of the functional layers FC1 to FC3 may have a film shape.

In the exemplary embodiment of the present disclosure, the first functional layer FC1 may be a polarizing functional layer that polarizes a light incident thereto. The second functional layer FC2 may be a shock absorbing functional layer that absorbs a shock applied thereto from the outside. The third functional layer FC3 may be a window functional layer that forms an exterior of the display device DD. According to another embodiment of the present disclosure, one or more layers of the first to third functional layers FC1 to FC3 may be omitted.

The base film BF, the shock absorbing member CSH, the heat discharging member RD, the electrostatic shielding member ESD, and the pressure sensing element PS are disposed on another side of the display module DM that is opposite to the side on which the functional layers FC1 to FC3 are disposed. For example, the base film BF, the shock absorbing member CSH, the heat discharging member RD, the electrostatic shielding member ESD, and the pressure sensing element are disposed under the display module DM in FIG. 2.

The base film BF is disposed under the display module DM. The base film BF is adhered to a lower side of the display module DM by a fourth adhesive member AD4.

The base film BF may include a polymer material. In the exemplary embodiment of the present disclosure, the base film BF may have a black color.

The shock absorbing member CSH is disposed under the base film BF. The shock absorbing member CSH is adhered to a lower side of the base film BF by a fifth adhesive member AD5.

The shock absorbing member CSH may include a polymer material. The shock absorbing member CSH can absorb a shock applied thereto from the outside.

In the exemplary embodiment of the present disclosure, the shock absorbing member CSH may include a thermoplastic polyurethane or a foam rubber.

The heat discharging member RD is disposed under the shock absorbing member CSH. The heat discharging member RD is adhered to a lower side of the shock absorbing member CSH by a sixth adhesive member AD6.

The heat discharging member RD can discharge heat generated from the display module DM to the outside. In the exemplary embodiment of the present disclosure, the heat discharging member RD may include a graphite or stainless.

The electrostatic shielding member ESD is disposed under the heat discharging member RD. The electrostatic shielding member ESD is adhered to a lower side of the heat discharging member RD by a seventh adhesive member AD7.

The electrostatic shielding member ESD can prevent or reduce static electricity that may interfere with and affect the display module DM. The electrostatic shielding member ESD may include a metal material. For example, the electrostatic shielding member ESD may include copper (Cu), iron (Fe), or aluminum (Al).

The pressure sensing element PS is disposed under the electrostatic shielding member ESD. The position of the pressure sensing area PSA (refer to FIG. 1) is determined depending on a position of the pressure sensing element PS.

In the exemplary embodiment of the present disclosure, the pressure sensing element PS overlaps a portion adjacent to an edge of the electrostatic shielding member ESD in the cross-sectional view, however, it should not be limited thereto or thereby. That is, the position of the pressure sensing element PS relative to the pressure sensing area PSA and/or the electrostatic shielding member ESD may be changed without deviating from the scope of the present disclosure.

In the exemplary embodiment of the present disclosure, at least one of the base film BF, the shock absorbing member CSH, the heat discharging member RD, the electrostatic shielding member ESD, and the fourth to seventh adhesive members AD4 to AD7 may be omitted without deviating from the scope of the present disclosure.

The bracket BRK is disposed under the pressure sensing element PS. The bracket BRK accommodates the display module DM, the base film BF, the shock absorbing member CSH, the heat discharging member RD, the electrostatic shielding member ESD, and the pressure sensing element PS.

Referring to FIG. 3A, the display module DM includes a display panel DP and an input sensing circuit ISC disposed on the display panel DP. The input sensing circuit ISC can sense a touch input and/or a pressure input applied thereto from the outside.

The input sensing circuit ISC may be directly disposed on a thin film encapsulation layer (not shown) of the display panel DP. Here, the expression "directly disposed" means that the input sensing circuit ISC is disposed on the display panel DP without an adhesive member.

Referring to FIG. 3B, a display module DM-1 includes the display panel DP, the input sensing circuit ISC, and an eighth adhesive member AD8. The display panel DP and the input sensing circuit ISC are adhered to each other by the eighth adhesive member AD8.

Figure 4:
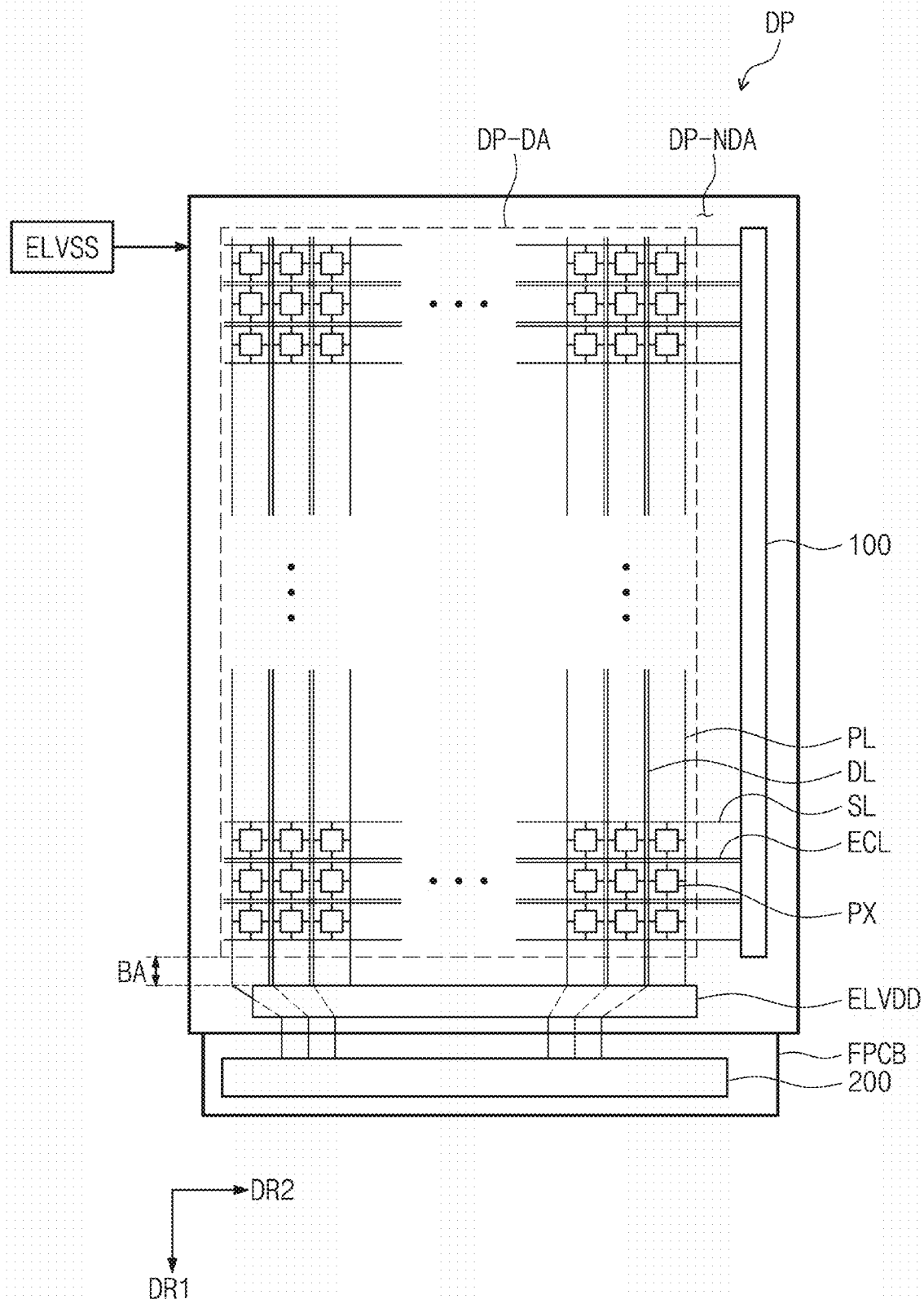
FIG. 4 is a plan view showing a display panel according to an exemplary embodiment of the present disclosure.

FIG. 4 is a plan view showing the display panel DP according to an exemplary embodiment of the present disclosure.

The display panel DP includes a display area DP-DA and a non-display area DP-NDA when viewed in a plan view. In the present exemplary embodiment, the non-display area DP-NDA is defined along an edge of the display area DP-DA. The display area DP-DA and the non-display area DP-NDA of the display panel DP may respectively correspond to the display area DA and the non-display area NDA of the display device DD shown in FIG. 1.

The display panel DP includes a scan driver 100, a data driver 200, a plurality of scan lines SL, a plurality of light emitting control lines ECL, a plurality of data lines DL, a plurality of power source lines PL, and a plurality of pixels PX. The pixels PX are arranged in the display area DP-DA. Each of the pixels PX includes an organic light emitting diode OLED (refer to FIG. 5) and a pixel circuit CC (refer to FIG. 5) connected to the organic light emitting diode OLED.

The scan driver 100 includes a scan driving member and a light emitting control driver.

The scan driving member generates scan signals and sequentially outputs the generated scan signals to the scan lines SL. The light emitting control driver generates light emitting control signals and outputs the generated light emitting control signals to the light emitting control lines ECL.

According to another embodiment of the present disclosure, the scan driving member and the light emitting control driver may be implemented in a single circuit in the scan driver 100 without being separated from each other.

The scan driver 100 may include a plurality of thin film transistors formed through the same process as that used to form a driving circuit of the pixels PX, for example, a low temperature polycrystalline silicon (LTPS) process or a low temperature polycrystalline oxide (LTPO) process.

The data driver 200 outputs data signals to the data lines DL. The data signals are analog voltages corresponding to grayscale values of image data.

In the exemplary embodiment of the present disclosure, the data driver 200 may be mounted on a printed circuit board FPCB, and the printed circuit board FPCB may be connected to pads arranged at one ends of the data lines DL, however, it should not be limited thereto or thereby. That is, the data driver 200 may be integrally implemented or directly mounted on the display panel DP.

The scan lines SL extend in the second direction DR2 and are arranged in the first direction DR1 crossing the second direction DR2. In the exemplary embodiment of the present disclosure, the second direction DR2 and the first direction DR1 may be perpendicular to each other, however, the extending and arranging directions of the scan lines SL should not be limited thereto or thereby.

The light emitting control lines ECL also extend in the second direction DR2 and are arranged in the first direction DR1. That is, each of the light emitting control lines ECL may be arranged parallel to a corresponding scan line among the scan lines SL.

The data lines DL extend in the first direction DR1 and are arranged in the second direction DR2 crossing the first direction DR1. The data lines DL transmit the data signals to corresponding pixels among the pixels PX.

The power source lines PL extend in the first direction DR1 and are arranged in the second direction DR2. The power source lines PL transmit a first power source ELVDD to corresponding pixels among the pixels PX.

Each of the pixels PX is connected to a corresponding scan line among the scan lines SL, a corresponding light emitting control line among the light emitting control lines ECL, a corresponding data line among the data lines DL, and a corresponding power source line among the power source lines PL.

The non-display area DP-NDA of the display panel DP includes a bending area BA. When the display panel DP is bent with respect to the bending area BA, a size of the non-display area DP-NDA decreases on a plane surface defined by the first direction DR1 and the second direction DR2, and thus the bezel of the display device DD becomes smaller. That is, a size of the non-display area NDA of the display device DD shown in FIG. 1 decreases after the display panel DP is bent.

Figure 5:
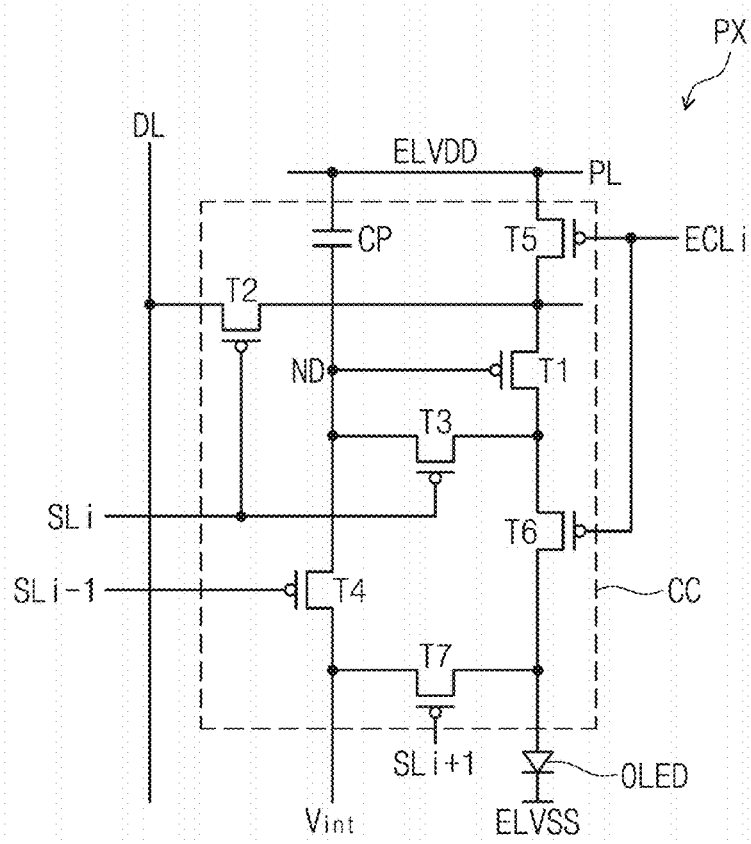
FIG. 5 is an equivalent circuit diagram showing a pixel according to an exemplary embodiment of the present disclosure.
Figure 6:
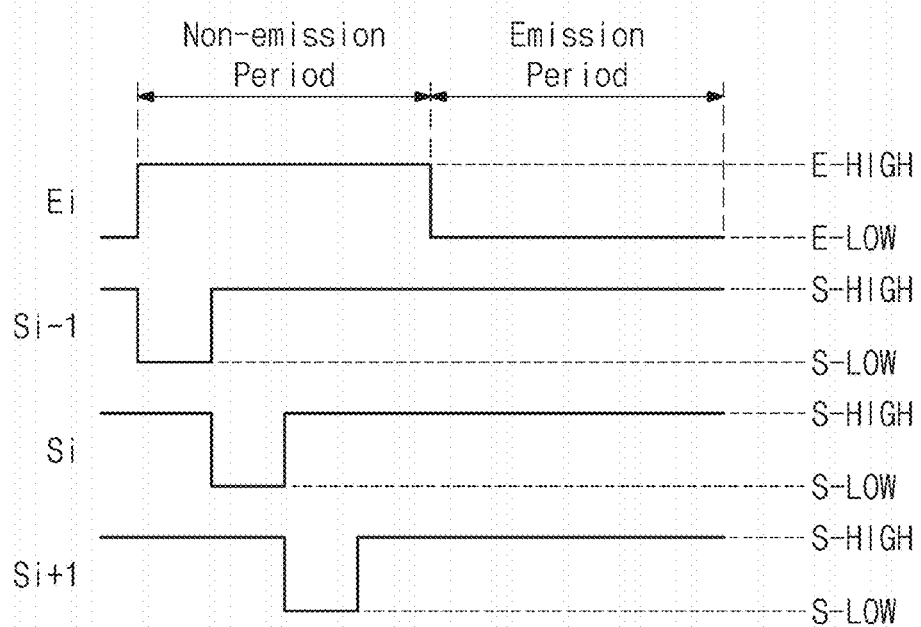
FIG. 6 is a waveform diagram showing a light emitting control signal and scan signals applied to the pixel shown in FIG. 5.

FIG. 5 is an equivalent circuit diagram showing the pixel PX according to an exemplary embodiment of the present disclosure. FIG. 6 is a waveform diagram showing the light emitting control signal Ei and the scan signals Si−1, S, and Si+1 applied to the pixel PX shown in FIG. 5. FIG. 5 shows the pixel PX connected to an i-th scan line SLi and an i-th light emitting control line ECLi.

The pixel PX includes the organic light emitting diode OLED and the pixel circuit CC. The pixel circuit CC includes a plurality of transistors T1 to T7 and a capacitor CP. The pixel circuit CC controls an amount of current flowing through the organic light emitting diode OLED in response to the data signal received from the data line DL.

The organic light emitting diode OLED emits a light with a predetermined brightness in response to the amount of current provided from the pixel circuit CC. To this end, a level of the first power source ELVDD is set higher than a level of a second power source ELVSS.

Each of the transistors T1 to T7 includes an input electrode (or source electrode), an output electrode (or drain electrode), and a control electrode (or gate electrode). In the following description, for the convenience of explanation, one electrode of the input electrode and the output electrode will be referred to as a "first electrode", and the other electrode of the input electrode and the output electrode will be referred to as a "second electrode".

A first electrode of a first transistor T1 is connected to the first power source ELVDD via a fifth transistor T5, and a second electrode of the first transistor T1 is connected to an anode electrode of the organic light emitting diode OLED via a sixth transistor T6. The first transistor T1 may be referred to as a "driving transistor".

The first transistor T1 controls the amount of the current flowing through the organic light emitting diode OLED in response to a voltage applied to a control electrode thereof.

A second transistor T2 is connected between the data line DL and the first electrode of the first transistor T1. A control electrode of the second transistor T2 is connected to the i-th scan line SLi. When an i-th scan signal Si is applied to the i-th scan line SLi, the second transistor T2 is turned on to electrically connect the data line DL and the first electrode of the first transistor T1.

A third transistor T3 is connected between the second electrode and the control electrode of the first transistor T1. A control electrode of the third transistor T3 is connected to the i-th scan line SLi. When the i-th scan signal Si is applied to the i-th scan line SLi, the third transistor T3 is turned on to electrically connect the second electrode and the control electrode of the first transistor T1. Accordingly, when the third transistor T3 is turned on, the first transistor T1 may be connected in a diode configuration.

A fourth transistor T4 is connected between a node ND and an initialization power source generator (not shown). A control electrode of the fourth transistor T4 is connected to an (i−1)th scan line SLi−1. When an (i−1)th scan signal Si−1 is applied to the (i−1)th scan line SLi−1, the fourth transistor T4 is turned on to apply an initialization voltage Vint to the node ND.

The fifth transistor T5 is connected between the power source line PL and the first electrode of the first transistor T1. A control electrode of the fifth transistor T5 is connected to the i-th light emitting control line ECLi.

The sixth transistor T6 is connected between the second electrode of the first transistor T1 and the anode electrode of the organic light emitting diode OLED. A control electrode of the sixth transistor T6 is connected to the i-th light emitting control line ECLi.

A seventh transistor T7 is connected between the initialization power source generator (not shown) and the anode electrode of the organic light emitting diode OLED. A control electrode of the seventh transistor T7 is connected to an (i+1)th scan line SLi+1. When an (i+1)th scan signal Si+1 is applied to the (i+1)th scan line SLi+1, the seventh transistor T7 is turned on to apply the initialization voltage Vint to the anode electrode of the organic light emitting diode OLED.

The seventh transistor T7 may improve a black expression ability of the pixel PX. In detail, when the seventh transistor T7 is turned on, a parasitic capacitance (not shown) of the organic light emitting diode OLED is discharged. In the absence of the seventh transistor T7, a leakage current flowing through the first transistor T1 may cause the organic light emitting diode OLED to emit light due to the parasitic capacitance when the data signal received at the pixel PX indicates the pixel PX to express a black color. Then, when implementing a black luminance, the organic light emitting diode OLED does not emit the light due to the discharge of the parasitic capacitance by the seventh transistor T7 even if there is a leakage current flowing the first transistor T1, and thus the black expression ability may be improved.

Additionally, in FIG. 5, the control electrode of the seventh transistor T7 is connected to the (i+1)th scan line SLi+1, however, the present disclosure should not be limited thereto or thereby. According to another embodiment of the present disclosure, the control electrode of the seventh transistor T7 may be connected to the i-th scan line SLi or the (i−1)th scan line SLi−1.

FIG. 5 shows p-type metal-oxide semiconductor (PMOS) transistors as an example of the transistors T1-T7 included in the pixel PX, however, the pixel PX should not be limited to the PMOS. According to another embodiment of the present disclosure, the pixel PX may be implemented by n-type metal-oxide semiconductor (NMOS) transistors. According to another embodiment of the present disclosure, the pixel PX may be implemented by a combination of NMOS and PMOS transistors.

The capacitor CP is connected between the power source line PL and the node ND. The capacitor CP is charged with a voltage corresponding to the data signal on the data line DL. When the fifth transistor T5 and the sixth transistor T6 are turned on by the voltage charged in the capacitor CP, the amount of the current flowing through the first transistor T1 is determined by the data signal.

In the present disclosure, the structure of the pixel PX should not be limited to the exemplary structure shown in FIG. 5. According to another embodiment of the present disclosure, the pixel PX may be implemented in various ways to allow the organic light emitting diode OLED to emit the light without deviating from the scope of the present disclosure.

Referring to FIG. 6, the light emitting control signal Ei may have a high level E-HIGH or a low level E-LOW. Each of the scan signals SLi−1, SLi, and SLi+1 has a high level S-HIGH or a low level S-LOW.

When the light emitting control signal Ei has the high level E-HIGH, the fifth transistor T5 and the sixth transistor T6 are turned off. When the fifth transistor T5 is turned off, the power source line PL and the first electrode of the first transistor T1 are electrically disconnected from each other. When the sixth transistor T6 is turned off, the second electrode of the first transistor T1 and the anode electrode of the organic light emitting diode OLED are electrically disconnected from each other. Accordingly, the organic light emitting diode OLED does not emit the light during a non-emission period in which the light emitting control signal Ei at the high level E-HIGH is applied to the i-th light emitting control line ECLi. During the non-emission period of the light emitting control signal Ei, the scan signals Si−1, Si, and Si+1 are applied in a sequential order.

Then, when the (i−1)th scan signal Si−1 applied to the (i−1)th scan line SLi−1 has the low level S-LOW, the fourth transistor T4 is turned on. When the fourth transistor T4 is turned on, the initialization voltage Vint is applied to the node ND.

When the i-th scan signal Si applied to the i-th scan line SLi has the low level S-LOW, the second transistor T2 and the third transistor T3 are turned on.

When the second transistor T2 is turned on, the data signal is applied to the first electrode of the first transistor T1. In this case, since the node ND is initialized to the initialization voltage Vint, the first transistor T1 is turned on. When the first transistor T1 is turned on, a voltage corresponding to the data signal is applied to the node ND. Then, the capacitor CP is charged with the voltage corresponding to the data signal.

When the (i+1)th scan signal Si+1 applied to the (i+1)th scan line SLi+1 has the low level S-LOW, the seventh transistor T7 is turned on.

When the seventh transistor T7 is turned on, the initialization voltage Vint is applied to the anode electrode of the organic light emitting diode OLED, and thus the parasitic capacitor of the organic light emitting diode OLED is discharged.

Following the non-emission period, when the light emitting control signal Ei having the low level E-LOW is applied to the light emitting control line ECLi during an emission period, the fifth transistor T5 and the sixth transistor T6 are turned on. When the fifth transistor T5 is turned on, the first power source ELVDD is applied to the first electrode of the first transistor T1. When the sixth transistor T6 is turned on, the second electrode of the first transistor T1 and the anode electrode of the organic light emitting diode OLED are electrically connected to each other. Then, the organic light emitting diode OLED emits the light with the predetermined brightness in response to the amount of the current provided thereto.

Figure 7:
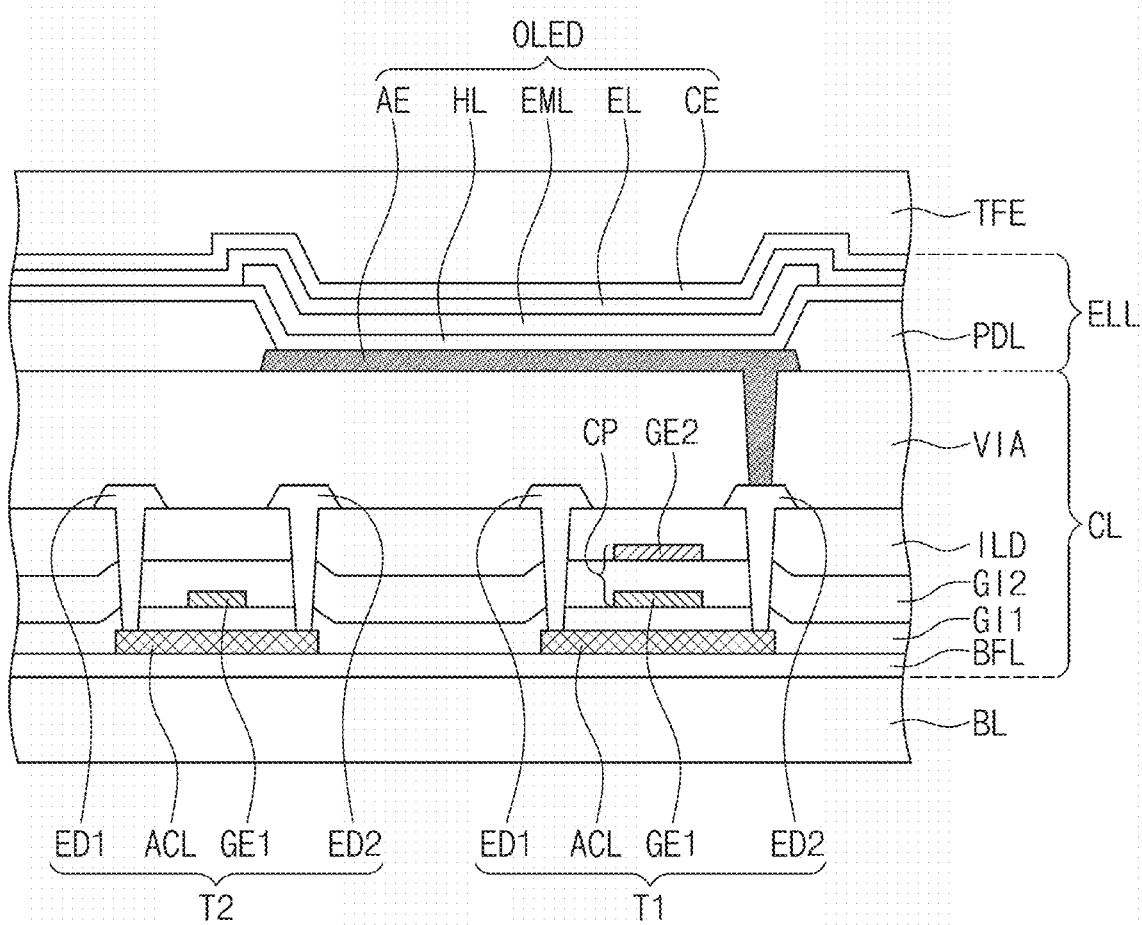
FIG. 7 is a cross-sectional view showing a portion of a pixel according to an exemplary embodiment of the present disclosure.

FIG. 7 is a cross-sectional view showing a portion of the pixel PX (refer to FIG. 5) according to an exemplary embodiment of the present disclosure. FIG. 7 shows the first transistor T1 and the second transistor T2 as a representative example, however, the structure of the first transistor T1 and the second transistor T2 should not be limited thereto or thereby. In FIG. 7, the second electrode ED2 of the first transistor T1 and the anode electrode AE of the organic light emitting diode OLED are shown to be directly connected to each other, but it should not be limited thereto or thereby. In the exemplary embodiment shown in FIG. 5, the first transistor T1 is connected to the anode electrode AE of the pixel PX via the sixth transistor T6. That is, according to some embodiments of the present disclosure, the second electrode ED2 of the first transistor T1 may directly make contact with the anode electrode AE of the pixel PX or the second electrode ED2 of the first transistor T1 may be connected to the anode electrode AE via the sixth transistor T6.

The display panel DP (refer to FIG. 4) includes a base member BL, a circuit layer CL, a light emitting device layer ELL, and an encapsulation layer TFE.

The circuit layer CL includes a buffer layer BFL, gate insulating layers GI1 and GI2, an interlayer insulating layer ILD, a circuit insulating layer VIA, and the first and second transistors T1 and T2.

The light emitting device layer ELL may include the organic light emitting diode OLED and a pixel definition layer PDL.

The encapsulation layer TFE encapsulates the light emitting device layer ELL to protect the light emitting device layer ELL from external oxygen or moisture.

The buffer layer BFL is disposed on one surface of the base member BL.

The buffer layer BFL prevents foreign substances in the base member BL from entering the pixel PX during a manufacturing process. In particular, the buffer layer BFL prevents the foreign substances from entering active portions ACL of the first and second transistors T1 and T2 of the pixel PX.

The foreign substances may inflow from the outside or may be generated when the base member BL is pyrolyzed. The foreign substances may be gas or sodium discharged from the base member BL. In addition, the buffer layer BFL can block moisture from entering the pixel PX from the outside.

The active portions ACL of the first and second transistors T1 and T2 are disposed on the buffer layer BFL. Each of the active portions ACL includes polysilicon or amorphous silicon. In another embodiment, the active portions ACL may include a metal oxide semiconductor.

The active portions ACL include first and second ion doping areas and a channel area that disposed between the first and second ion doping areas. The channel area serves as a passage through which electrons or holes move between the first and second ion doping areas.

A first gate insulating layer GI1 is disposed above the buffer layer BFL to cover the active portions ACL. The first gate insulating layer GI1 may include an organic layer and/or an inorganic layer. The first gate insulating layer GI1 may include a plurality of inorganic thin film layers.

Examples of the inorganic thin film layers include, but are not limited to, a silicon nitride layer and a silicon oxide layer.

The control electrodes GE1 of the first and second transistors T1 and T2 are disposed on the first gate insulating layer GI1. The control electrode GE1 of the first transistor T1 may be one of two electrodes forming the capacitor CP. At least some portions of the scan lines SL (refer to FIG. 4) and the light emitting control lines ECL (refer to FIG. 4) are disposed on the first gate insulating layer GI1.

A second gate insulating layer GI2 is disposed on the first gate insulating layer GI1 to cover the control electrodes GE1. The second gate insulating layer GI2 may include an organic layer and/or an inorganic layer. The second gate insulating layer GI2 may include a plurality of inorganic thin film layers. Examples of the inorganic thin film layers include, but are not limited to, a silicon nitride layer and a silicon oxide layer.

The other electrode of the two electrodes forming the capacitor CP (refer to FIG. 5) is referred to as an electrode GE2, and the electrode GE2 is disposed on the second gate insulating layer GI2. That is, the control electrode GE1 disposed on the first gate insulating layer GI1 overlaps the electrode GE2 disposed on the second gate insulating layer GI2 to form the capacitor CP shown in FIG. 5. However, positions of the electrodes forming the capacitor CP should not be limited thereto or thereby.

The interlayer insulating layer ILD is disposed on the second gate insulating layer GI2 to cover the electrode GE2. The interlayer insulating layer ILD may include an organic layer and/or an inorganic layer. The interlayer insulating layer ILD may include a plurality of inorganic thin film layers. Examples of the inorganic thin film layers include, but are not limited to, a silicon nitride layer and a silicon oxide layer.

At least some portions of the data line DL (refer to FIG. 4) and the power line PL (refer to FIG. 4) may be disposed on the interlayer insulating layer ILD. The first electrodes ED1 and the second electrodes ED2 of the first and second transistors T1 and T2 may be disposed on the interlayer insulating layer ILD.

The first electrodes ED1 and the second electrodes ED2 are connected to the corresponding active portions ACL through respective thru-holes defined through the gate insulating layers GI1 and GI2 and the interlayer insulating layer ILD.

The circuit insulating layer VIA is disposed on the interlayer insulating layer ILD to cover the first electrodes ED1 and the second electrodes ED2 of the first and second transistors T1 and T2. The circuit insulating layer VIA may include an organic layer and/or an inorganic layer. The circuit insulating layer VIA provides a flat surface.

The pixel definition layer PDL and the organic light emitting diode OLED are disposed on the circuit insulating layer VIA.

The organic light emitting diode OLED may include the anode electrode AE, a hole control layer HL, a light emitting layer EML, an electron control layer EL, and a cathode electrode CE.

Figure 8:
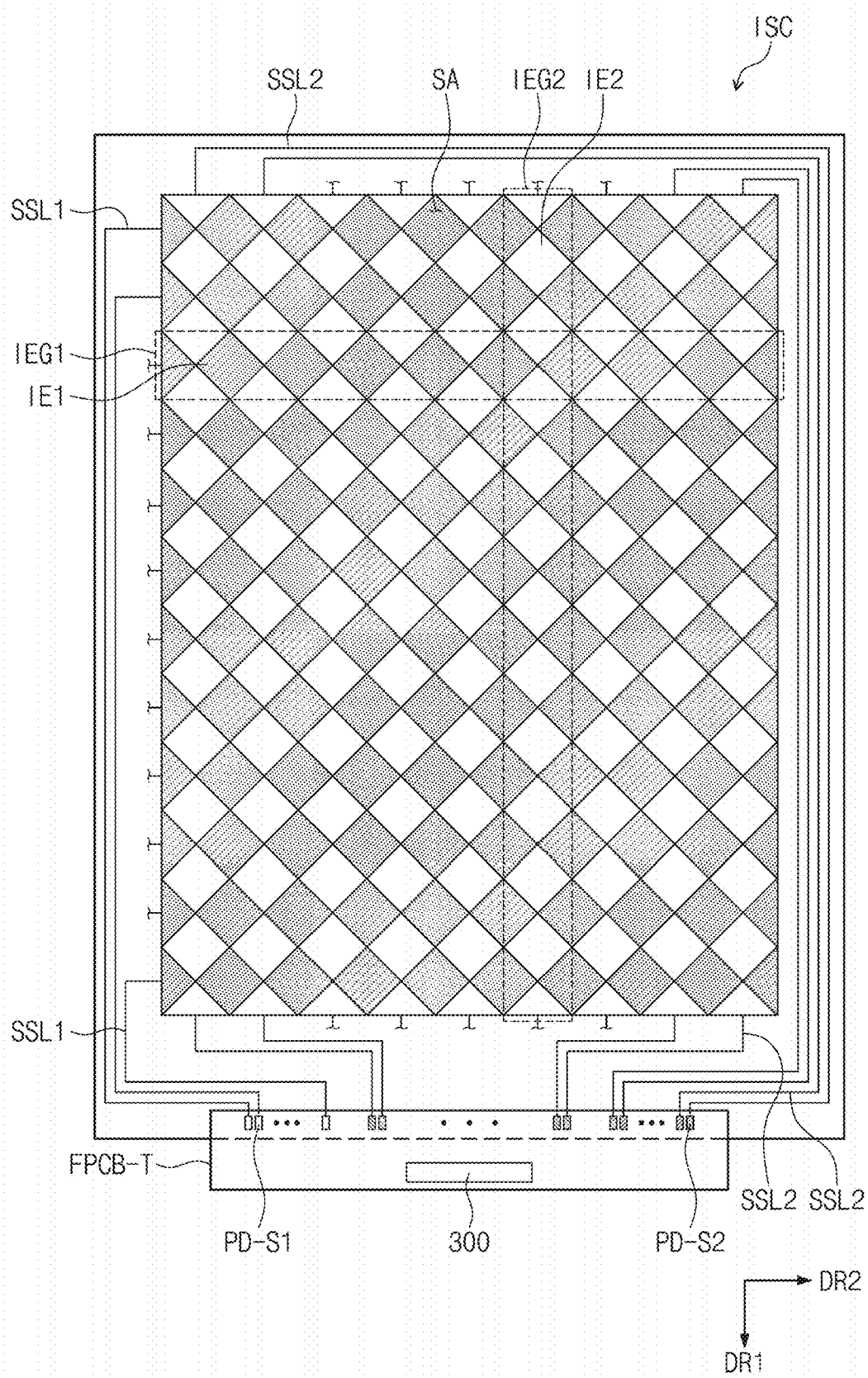
FIG. 8 is a plan view showing an input sensing circuit according to an exemplary embodiment of the present disclosure.

FIG. 8 is a plan view showing the input sensing circuit ISC according to an exemplary embodiment of the present disclosure.

The input sensing circuit ISC may include an input sensing area SA defined therein to sense the external input.

The input sensing circuit ISC may include first sensor groups IEG1, second sensor groups IEG2, first signal lines SSL1, second signal lines SSL2, signal pads PD-S1 and PD-S2, a printed circuit board FPCB-T, and an input sensing driver 300.

Each of the first sensor groups IEG1 may extend in the second direction DR2, and the first sensor groups IEG1 may be arranged in the first direction DR1. Each of the first sensor groups IEG1 may include a plurality of first sensor patterns (hereinafter, also refer to as a "first sensor") IE1. As an example, the first sensor IE1 may be a receiving (Rx) sensor.

Each of the second sensor groups IEG2 may extend in the first direction DR1, and the second sensor groups IEG2 may be arranged in the second direction DR2. Each of the second sensor groups IEG2 may include a plurality of second sensor patterns (hereinafter, also referred to as a "second sensor") IE2. As an example, the second sensor IE2 may be a transmitting (Tx) sensor.

In the exemplary embodiment of the present disclosure, a length obtained by measuring the first sensor group IEG1 in the second direction DR2 may be shorter than a length obtained by measuring the second sensor group IEG2 in the first direction DR1, however, it should not be limited thereto or thereby.

In the exemplary embodiment of the present disclosure, each of the first sensors IE1 may be capacitively coupled to the second sensors IE2 adjacent thereto among the second sensors IE2 to form a capacitor. In the exemplary embodiment of the present disclosure, each of the first sensors IE1 and the second sensors IE2 may form a capacitor with a nearby external object (e.g., a person's finger).

In the exemplary embodiment of the present disclosure, the input sensing circuit ISC may sense a variation in capacitance formed between the first sensors IE1 and the second sensors IE2 to determine whether an external input is applied thereto. In the exemplary embodiment of the present disclosure, the input sensing circuit ISC may sense a variation in capacitance formed between the first sensors IE1 and the external object and/or between the second sensors IE2 and the external object to determine whether the external input is applied thereto.

The first signal lines SSL1 may be electrically connected to the first sensor groups IEG1, respectively. In the exemplary embodiment of the present disclosure, the first signal lines SSL1 may be connected to the first sensor groups IEG1 in a single routing structure at one end of the first sensor groups IEG1 (e.g., the left end as shown in FIG. 8), however, it should not be limited thereto or thereby. For example, two first signal lines SSL1 may be connected to the first sensor groups IEG1 in a dual routing structure at both ends of the first sensor groups IEG1.

The second signal lines SSL2 may be electrically connected to the second sensor groups IEG2, respectively. In the exemplary embodiment of the present disclosure, the second signal lines SSL2 may be connected to the second sensor groups IEG2 in a double routing structure (e.g., both top and bottom ends of the second sensor groups IEG2 as shown in FIG. 8), however, they should not be limited thereto or thereby. According to another embodiment of the present disclosure, the second signal lines SSL2 may be connected to the second sensor groups IEG2 in a single routing structure (e.g., either one of the top or bottom ends of the second sensor groups IEG2).

The first signal pads PD-S1 may be connected to at least one of the first signal lines SSL1. The second signal pads PD-S2 may be connected to at least one of the second signal lines SSL2.

The printed circuit board FPCB-T may be electrically connected to the signal pads PD-S1 and PD-S2.

The input sensing driver 300 may be mounted on the printed circuit board FPCB-T. The input sensing driver 300 may transmit, receive, or calculate electrical signals to determine whether the user's touch occurs in the input sensing area SA and whether a pressure input is applied to the input sensing area SA.

Figure 9:
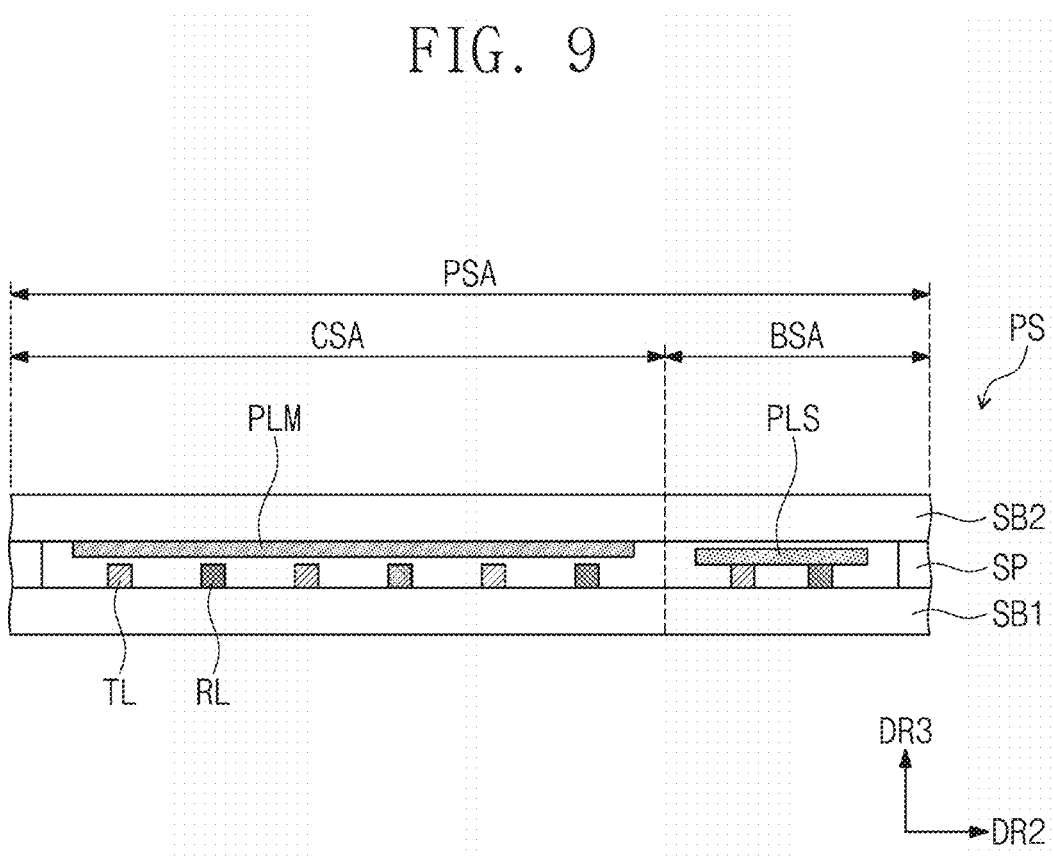
FIG. 9 is a cross-sectional view showing a portion of a pressure sensing element according to an exemplary embodiment of the present disclosure.
Figure 10:
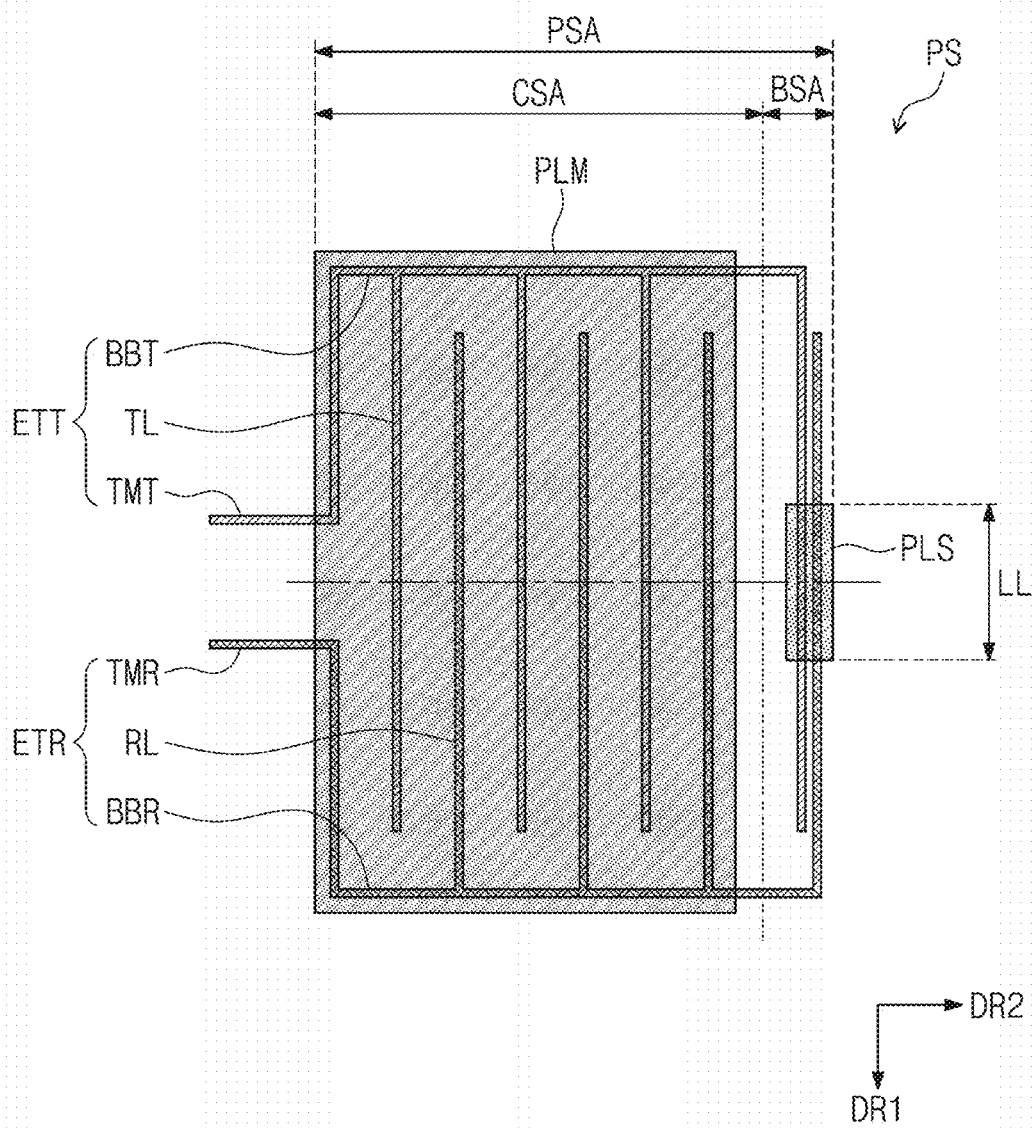
FIG. 10 is a plan view showing a portion of a pressure sensing element according to an exemplary embodiment of the present disclosure.

FIG. 9 is a cross-sectional view showing a portion of the pressure sensing element PS shown in FIG. 2 according to an exemplary embodiment of the present disclosure. FIG. 10 is a plan view showing a portion of the pressure sensing element PS according to an exemplary embodiment of the present disclosure.

Referring to FIGS. 9 and 10, the pressure sensing element PS includes a first base SB1, a second base SB2, a transmitting electrode ETT, a receiving electrode ETR, a main pressure sensing layer PLM, a sub-pressure sensing layer PLS, and a sealing member SP. For the convenience of explanation, the first and second bases SB1 and SB2 are not shown in FIG. 10.

The first base SB1 may be a film including a polymer resin, for example, polyimide. The first base SB1 may have an insulating property.

The transmitting electrode ETT and the receiving electrode ETR may be disposed on the first base SB1.

The transmitting electrode ETT may include a transmitting terminal TMT, a transmitting bus BBT, and a plurality of transmitting lines TL. Each of the transmitting terminal TMT, the transmitting bus BBT, and the transmitting lines TL may have substantially the same thickness. Each of the transmitting terminal TMT, the transmitting bus BBT, and the transmitting lines TL may include a conductive material.

The receiving electrode ETR may include a receiving terminal TMR, a receiving bus BBR, and a plurality of receiving lines RL. Each of the receiving terminal TMR, the receiving bus BBR, and the receiving lines RL may have substantially the same thickness. Each of the receiving terminal TMR, the receiving bus BBR, and the receiving lines RL may include a conductive material. In one embodiment, the transmitting electrode ETT and the receiving electrode ETR may include the same conductive material. In another embodiment, the transmitting electrode ETT and the receiving electrode ETR may include different conductive materials.

In the exemplary embodiment of the present disclosure, the transmitting terminal TMT and the receiving terminal TMR may be electrically connected to the input sensing driver 300 (refer to FIG. 8).

The transmitting bus BBT may be a wiring that electrically connects the transmitting terminal TMT and the transmitting lines TL. In FIG. 10, the transmitting bus BBT extends in the second direction DR2, however, it should not be limited thereto or thereby.

The receiving bus BBR may be a wiring that electrically connects the receiving terminal TMR and the receiving lines RL. In FIG. 10, the receiving bus BBR extends in the second direction DR2, however, it should not be limited thereto or thereby.

The transmitting lines TL extend from the transmitting bus BBT, and the receiving lines RL extend from the receiving bus BBR.

Each of the transmitting lines TL and the receiving lines RL may extend in the first direction DR1.

On the plane surface defined by the first direction DR1 and the second direction DR2, the transmitting terminal TMT and the receiving terminal TMR may be disposed adjacent to one side portion of the main pressure sensing layer PLM, and the sub-pressure sensing layer PLS may be disposed adjacent to the other side portion of the main pressure sensing layer PLM.

The main pressure sensing layer PLM and the sub-pressure sensing layer PLS may be disposed on the transmitting electrode ETT and the receiving electrode ETR. The main pressure sensing layer PLM and the sub-pressure sensing layer PLS do not overlap each other in the third direction DR3 as shown in FIG. 9.

The main pressure sensing layer PLM may have an area greater than that of the sub-pressure sensing layer PLS.

Referring to FIG. 9, the main pressure sensing layer PLM may be spaced apart from the transmitting electrode ETT and the receiving electrode ETR by a set distance in the third direction DR3. The main pressure sensing layer PLM may make contact with the second base SB2 on a side opposite from the transmitting electrode ETT and the receiving electrode ETR.

The sub-pressure sensing layer PLS may make contact with the transmitting electrode ETT and the receiving electrode ETR. The sub-pressure sensing layer PLS may be spaced apart from the second base SB2 by a set distance on a side opposite from the transmitting electrode ETT and the receiving electrode ETR in the third direction DR3.

The main pressure sensing layer PLM and the sub-pressure sensing layer PLS may include a conductive material. For example, at least one of the main pressure sensing layer PLM and the sub-pressure sensing layer PLS may include a polymer resin and metal particles. In the exemplary embodiment of the present disclosure, each of the metal particles may be dispersed in the polymer resin and may have a size in the order of nanometers.

At least one of the main pressure sensing layer PLM and the sub-pressure sensing layer PLS may have a conductivity due to a tunneling effect that occurs between the metal particles when a pressure input is applied thereto from the outside.

In the exemplary embodiment of the present disclosure, at least one of the main pressure sensing layer PLM and the sub-pressure sensing layer PLS may include a pressure conductive rubber.

In the exemplary embodiment of the present disclosure, at least one of the main pressure sensing layer PLM and the sub-pressure sensing layer PLS may include a quantum tunneling composite (QTC).

In the exemplary embodiment of the present disclosure, the sub-pressure sensing layer PLS may exhibit the conductivity property at all times regardless of the pressure applied thereto from the outside.

The second base SB2 may be disposed on the main pressure sensing layer PLM and the sub-pressure sensing layer PLS. The second base SB2 may make contact with the main pressure sensing layer PLM and may be spaced apart from the sub-pressure sensing layer PLS by a set distance as shown in FIG. 9.

The second base SB2 may be a film including a polymer resin, for example, polyimide. The second base SB2 may have an insulating property.

The sealing member SP may couple the first base SB1 and the second base SB2. In the exemplary embodiment of the present disclosure, the sealing member SP may be an adhesive member, for example, a pressure sensitive adhesive.

When the pressure is applied from the outside through the second base BS2, the main pressure sensing layer PLM may make contact with at least a portion of the transmitting electrode ETT and the receiving electrode ETR. Accordingly, a resistance value between the transmitting terminal TMT and the receiving terminal TMR (hereinafter, referred to as a "measured resistance value") formed by the transmitting electrode ETT, the receiving electrode ETR, the main pressure sensing layer PLM, and the sub-pressure sensing layer PLS varies. The input sensing driver 300 (refer to FIG. 8) may sense a variation in the measured resistance value and may determine whether the pressure is applied to the display device DD (refer to FIG. 1).

Even when no pressure is applied from the outside, the transmitting electrode ETT and the receiving electrode ETR are still electrically connected to each other by the sub-pressure sensing layer PLS. Therefore, the input sensing driver 300 (refer to FIG. 8) may sense a resistance value between the transmitting terminal TMT and the receiving terminal TMR (hereinafter, referred to as an "initial resistance value") formed by the transmitting electrode ETT, the receiving electrode ETR, and the sub-pressure sensing layer PLS.

The input sensing driver 300 (refer to FIG. 8) may sense the initial resistance value and may determine whether a disconnection occurs in the transmitting electrode ETT and the receiving electrode ETR. In detail, when the initial resistance value is measured to be within a set range, the input sensing driver 300 (refer to FIG. 8) may determine that no disconnection has occurred in an electrical path between the transmitting electrode ETT and the receiving electrode ETR, and when the initial resistance value is measured at infinity or above a set value, the input sensing driver 300 may determine that the disconnection has occurred in the electrical path between the transmitting electrode ETT and the receiving electrode ETR.

The initial resistance value may vary without deviating from the scope of the present disclosure. For example, the initial resistance value may vary based on a variance in at least one of (1) a length of lines disposed at outermost positions among the transmitting lines TL and the receiving lines RL, (2) a thickness of lines disposed at outermost positions among the transmitting lines TL and the receiving lines RL, and (3) a length LL of the sub-pressure sensing layer PLS. However, it is understood that the initial resistance value may vary based on other variables without deviating from the scope of the present disclosure.

In the exemplary embodiment of the present disclosure, the number of the transmitting lines TL may be equal to the number of the receiving lines RL. Since the measured resistance value is determined by transmitting an electrical signal from the input sensing driver 300 (refer to FIG. 8) to the receiving lines RL through the transmitting lines TL and the main pressure sensing layer PLM, the electrical signal may be stable when the number of the transmitting lines TL is equal to the number of the receiving lines RL.

The pressure sensing area PSA may include a contact sensing area CSA and a defect sensing area BSA. The contact sensing area CSA may correspond to an area in which the main pressure sensing layer PLM is disposed, and the defect sensing area BSA may correspond to an area in which the sub-pressure sensing layer PLS is disposed.

As a distance from the defect sensing area BSA to the transmitting terminal TMT and the receiving terminal TMR increases, the pressure sensing area PSA increases, and the input sensing driver 300 (refer to FIG. 8) may sense defects (or disconnection) in larger areas.

Figure 11B:
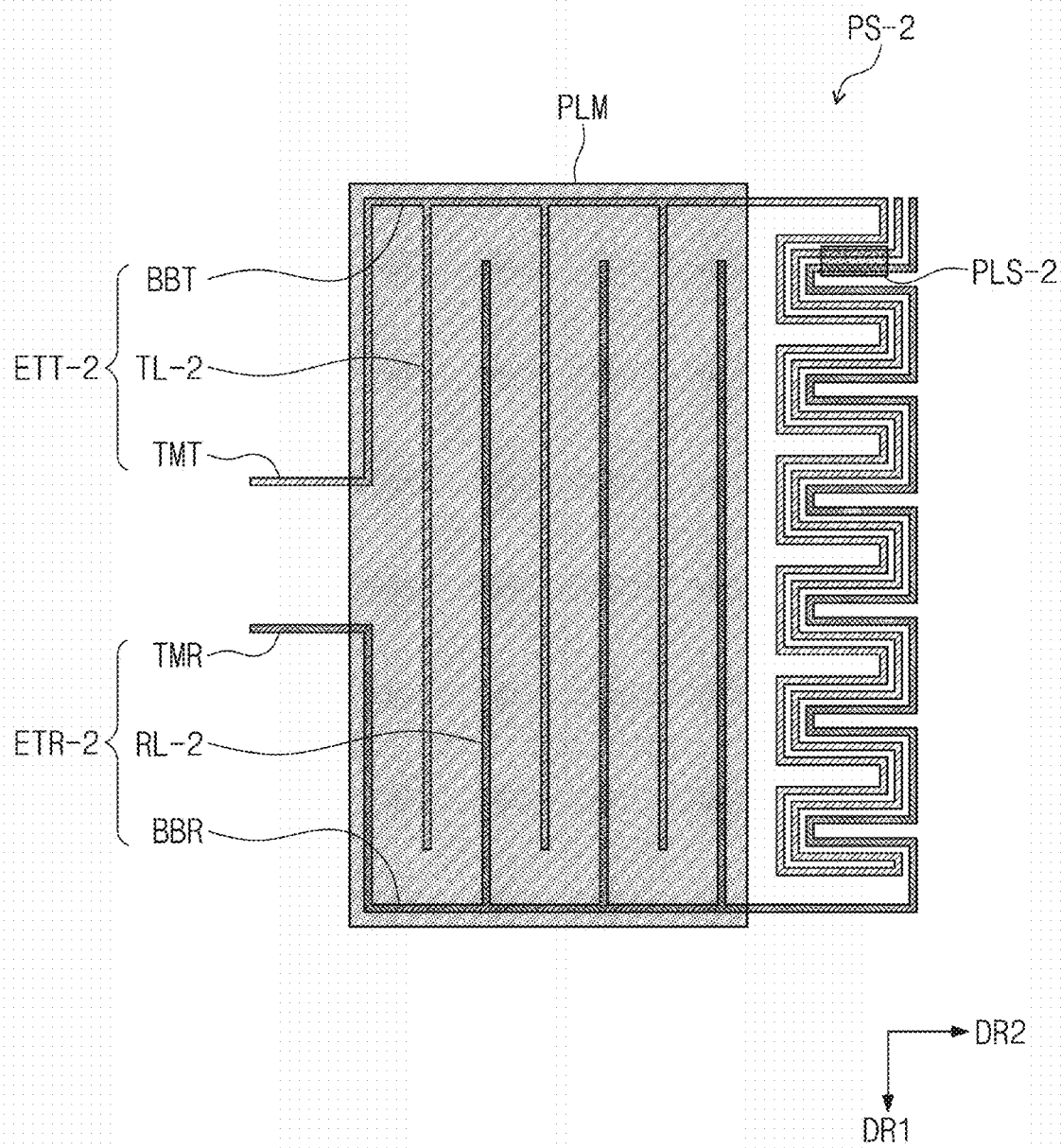

FIGS. 11A and 11B are plan views showing examples of a portion of pressure sensing elements PS-1 and PS-2 according to an exemplary embodiment of the present disclosure.

Referring to FIG. 11A, a transmitting electrode ETT-1 of the pressure sensing element PS-1 may include a transmitting terminal TMT, a transmitting bus BBT, and a plurality of transmitting lines TL-1. Among the transmitting lines TL-1, lines disposed at outermost positions have a twisted shape that is different from the lines disposed at the outermost positions among the transmitting lines TL shown in FIG. 10.

A receiving electrode ETR-1 of the pressure sensing element PS-1 may include a receiving terminal TMR, a receiving bus BBR, and a plurality of receiving lines RL-1. Among the receiving lines RL-1, lines disposed at the outermost positions have a twisted shape that is different from the lines disposed at the outermost positions among the receiving lines RL shown in FIG. 10.

A shape and a position of a sub-pressure sensing layer PLS-1 of the pressure sensing element PS-1 shown in FIG. 11A may be different from those of the sub-pressure sensing layer PLS of the pressure sensing element PS shown in FIG. 10 due to a variation in the shape of the transmitting lines TL-1 and the receiving lines RL-1.

Accordingly, an initial resistance value of the pressure sensing element PS-1 shown in FIG. 11A may be greater than the initial resistance value of the pressure sensing element PS shown in FIG. 10 due to the increased lengths of the transmitting lines TL-1 and the receiving lines RL-1.

Description on the other components of the pressure sensing element PS-1 is substantially the same as those described with reference to FIGS. 9 and 10, and thus details thereof will be omitted.

Referring to FIG. 11B, a transmitting electrode ETT-2 of the pressure sensing element PS-2 may include a transmitting terminal TMT, a transmitting bus BBT, and a plurality of transmitting lines TL-2. Among the transmitting lines TL-2, lines disposed at outermost positions have a shape more twisted than the lines disposed at the outermost positions among the transmitting lines TL and TL-1 respectively shown in FIGS. 10 and 11A.

A receiving electrode ETR-2 of the pressure sensing element PS-2 may include a receiving terminal TMR, a receiving bus BBR, and a plurality of receiving lines RL-2. Among the receiving lines RL-2, lines disposed at the outermost positions have a twisted shape different from the lines disposed at the outermost positions among the receiving lines RL and RL-1 shown in FIGS. 10 and 11A.

A shape and a position of a sub-pressure sensing layer PLS-2 of the pressure sensing element PS-2 may be different from those of the sub-pressure sensing layers PLS and PLS-1 of the pressure sensing elements PS and PS-1 respectively shown in FIGS. 10 and 11A due to a variation in the shape of the transmitting lines TL-2 and the receiving lines RL-2.

Accordingly, an initial resistance value of the pressure sensing element PS-2 shown in FIG. 11B may be greater than the initial resistance value of the pressure sensing element PS shown in FIG. 10 and the initial resistance value of the pressure sensing element PS-1 shown in FIG. 11A due to the increased lengths of the transmitting lines TL-1 and/or the receiving lines RL-1.

Description on the other components of the pressure sensing element PS-2 is substantially the same as those of the pressure sensing element PS described with reference to FIGS. 9 and 10, and thus details thereof will be omitted.

FIGS. 12 and 13A to 13C are plan views showing examples of a portion of pressure sensing elements PS-3, PS-4, PS-5, and PS-6 according to an exemplary embodiment of the present disclosure.

Figure 12:
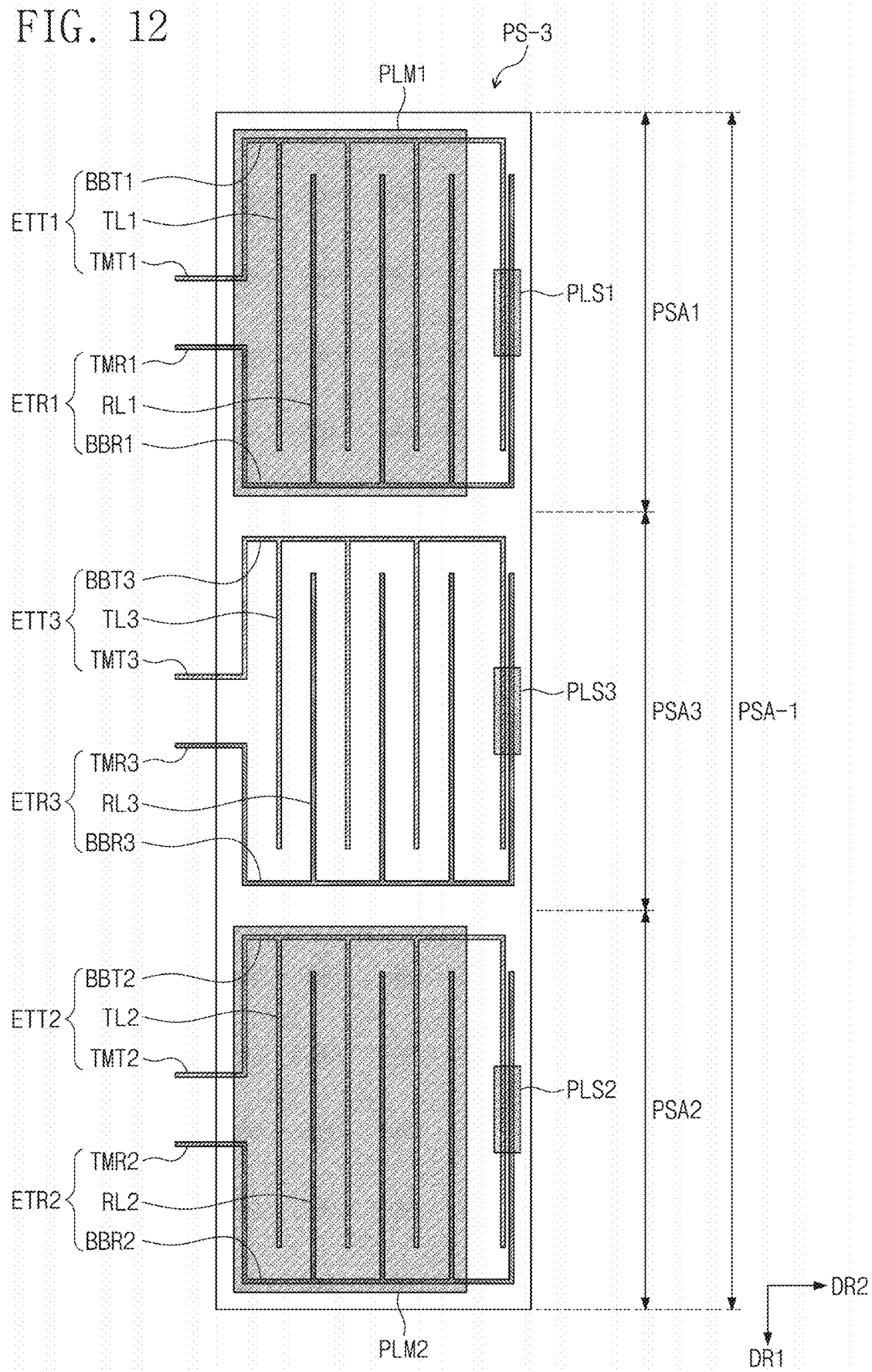
FIGS. 12 and 13A to 13C are plan views showing examples of a portion of pressure sensing elements according to an exemplary embodiment of the present disclosure.

Referring to FIG. 12, a pressure sensing area PSA-1 may include a first pressure sensing area PSA1, a second pressure sensing area PSA2, and a third pressure sensing area PSA3 (hereinafter, also referred to as a reference area). For the convenience of explanation, the bases SB1 and SB2 and the sealing member SP are not shown in FIG. 12.

A first transmitting electrode ETT1, a first receiving electrode ETR1, a first main pressure sensing layer PLM1, and a first sub-pressure sensing layer PLS1 may be disposed in the first pressure sensing area PSA1.

The first transmitting electrode ETT1 may include a first transmitting terminal TMT1, a first transmitting bus BBT1, and a plurality of first transmitting lines TL1.

The first receiving electrode ETR1 may include a first receiving terminal TMR1, a first receiving bus BBR1, and a plurality of first receiving lines RL1.

Description on the components disposed in the first pressure sensing area PSA1 is substantially the same as those of the components disposed in the pressure sensing area PSA shown in FIGS. 9 and 10.

A second transmitting electrode ETT2, a second receiving electrode ETR2, a second main pressure sensing layer PLM2, and a second sub-pressure sensing layer PLS2 may be disposed in the second pressure sensing area PSA2.

The second transmitting electrode ETT2 may include a second transmitting terminal TMT2, a second transmitting bus BBT2, and a plurality of second transmitting lines TL2.

The second receiving electrode ETR2 may include a second receiving terminal TMR2, a second receiving bus BBR2, and a plurality of second receiving lines RL2.

Description on the components disposed in the second pressure sensing area PSA2 is substantially the same as those of the components disposed in the pressure sensing area PSA shown in FIGS. 9 and 10.

The third pressure sensing area PSA3 (or the reference area) may be disposed between the first pressure sensing area PSA1 and the second pressure sensing area PSA2.

A third transmitting electrode ETT3, a third receiving electrode ETR3, and a third sub-pressure sensing layer PLS3 may be disposed in the third pressure sensing area PSA3 (or the reference area). That is, different from the first pressure sensing area PSA1 and the second pressure sensing area PSA2, a main pressure sensing layer is not disposed in the third pressure sensing area PSA3 (or the reference area).

The third sub-pressure sensing layer PLS3 may be disposed between the first sub-pressure sensing layer PLS1 and the second sub-pressure sensing layer PLS2 in the first direction DR1.

The third transmitting electrode ETT3 may include a third transmitting terminal TMT3, a third transmitting bus BBT3, and a plurality of third transmitting lines TL3.

The third receiving electrode ETR3 may include a third receiving terminal TMR3, a third receiving bus BBR3, and a plurality of third receiving lines RL3.

Description on the components disposed in the third pressure sensing area PSA3 (or the reference area) is substantially the same as those of the components (except for the main pressure sensing layer) disposed in the pressure sensing area PSA shown in FIGS. 9 and 10.

The resistance value measured in the pressure sensing area PSA-1 by the input sensing driver 300 may vary depending on a variation in environmental and/or operating conditions such as temperature and humidity in addition to a pressure input provided from the outside. The pressure sensing element PS-3 can distinguish whether the variation in resistance value measured by the input sensing driver 300 is due to the pressure input or the environmental and/or operating conditions (e.g., temperature, humidity) and accurately determine whether the pressure input is applied.

Different from the first pressure sensing area PSA1 and the second pressure sensing area PSA2, the main pressure sensing layer is not disposed in the third pressure sensing area PSA3 (or the reference area). Thus, the resistance value measured by the third transmitting terminal TMT3 and the third receiving terminal TMR3 may not vary even though the pressure input is applied from the outside. That is, the resistance value measured by the third transmitting terminal TMT3 and the third receiving terminal TMR3 may indicate the variance of the resistance value caused only by the environmental and/or operating conditions (e.g., temperature, humidity).

That is, the pressure sensing element PS-3 can accurately determine whether the pressure input is applied by comparing the resistance value measured by the first transmitting terminal TMT1 and the first receiving terminal TMR1 with the resistance value measured by the third transmitting terminal TMT3 and the third receiving terminal TMR3 or by comparing the resistance value measured by the second transmitting terminal TMT2 and the second receiving terminal TMR2 with the resistance value measured by the third transmitting terminal TMT3 and the third receiving terminal TMR3. For example, the amount of the variance in the measured resistance value caused by the pressure input can be accurately measured by subtracting the variance of the resistance value that is measured in the third pressure sensing area PSA3 from each of the measured resistance values in the first pressure sensing area PSA1 and the second pressure sensing area PSA2.

Figure 13A:
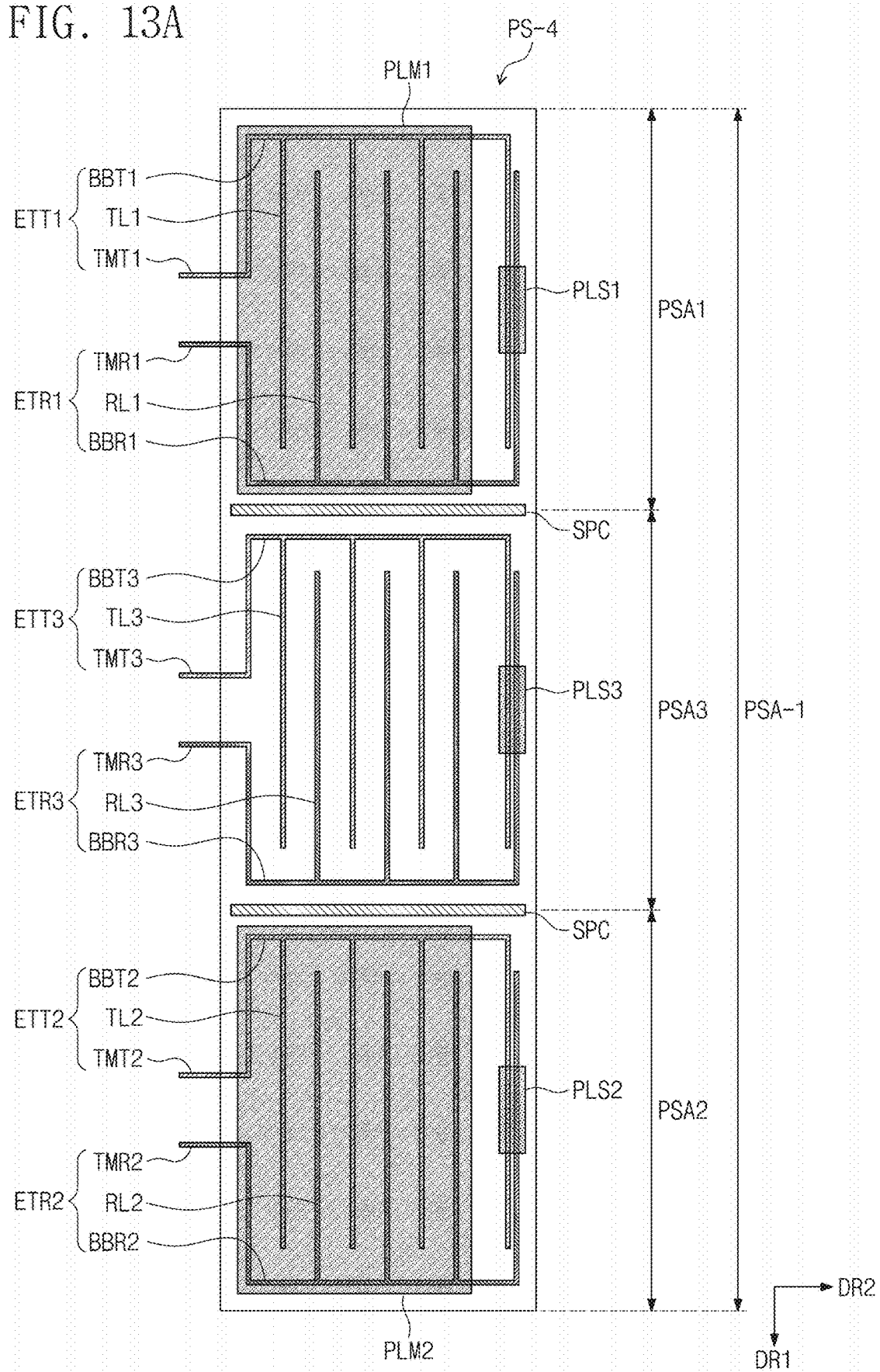

Referring to FIG. 13A, a pressure sensing element PS-4 according to an exemplary embodiment of the present disclosure may further include spacers SPC.

The spacers SPC may be arranged in a boundary area between the first pressure sensing area PSA1 and the third pressure sensing area PSA3 and another boundary area between the second pressure sensing area PSA2 and the third pressure sensing area PSA3.

The spacers SPC may support the first base SB1 (refer to FIG. 9) and the second base SB2 (refer to FIG. 9) to be spaced apart from each other. The spacers SPC may include a polymer resin.

Figure 13B:
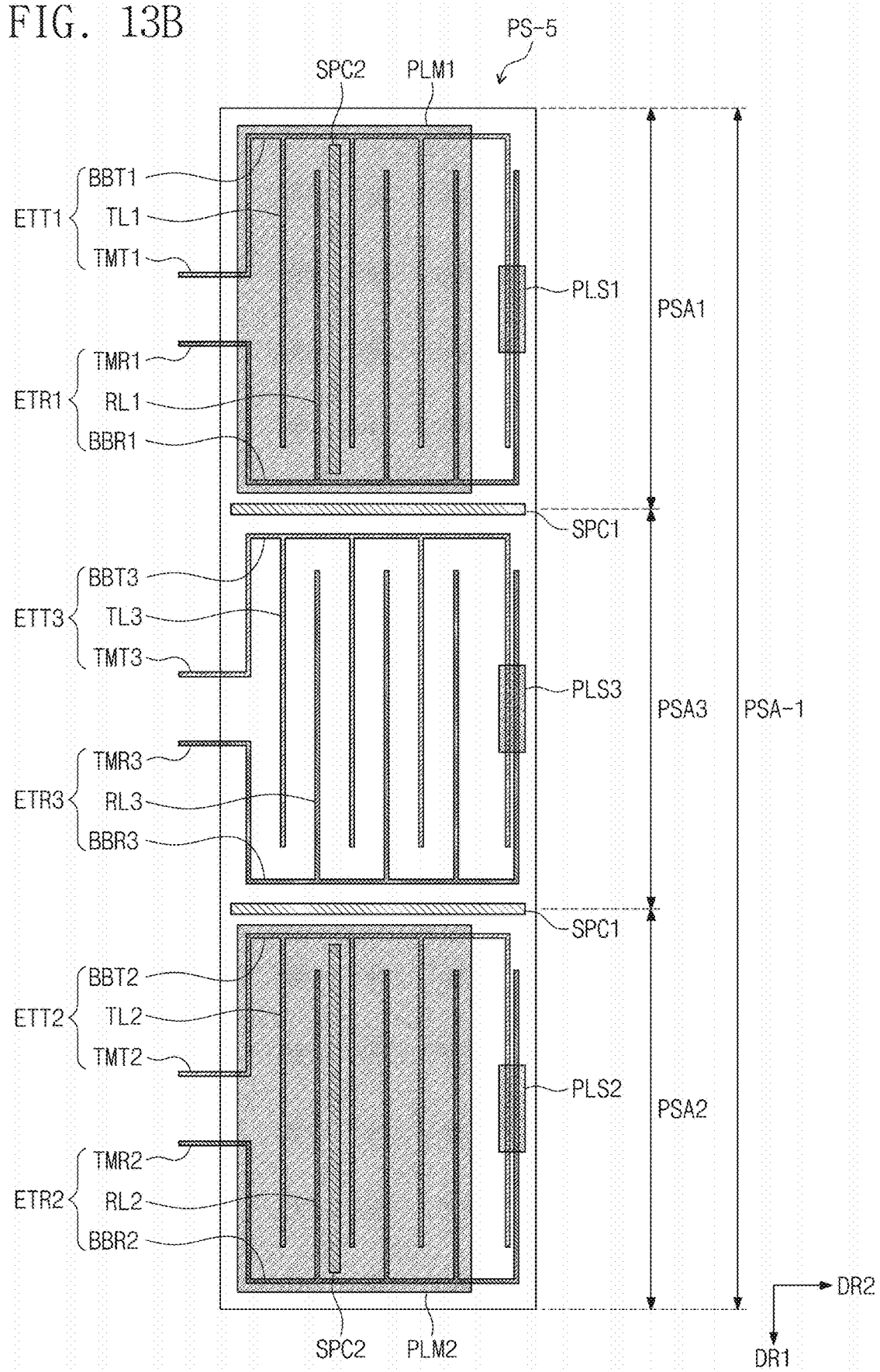
Figure 13C:
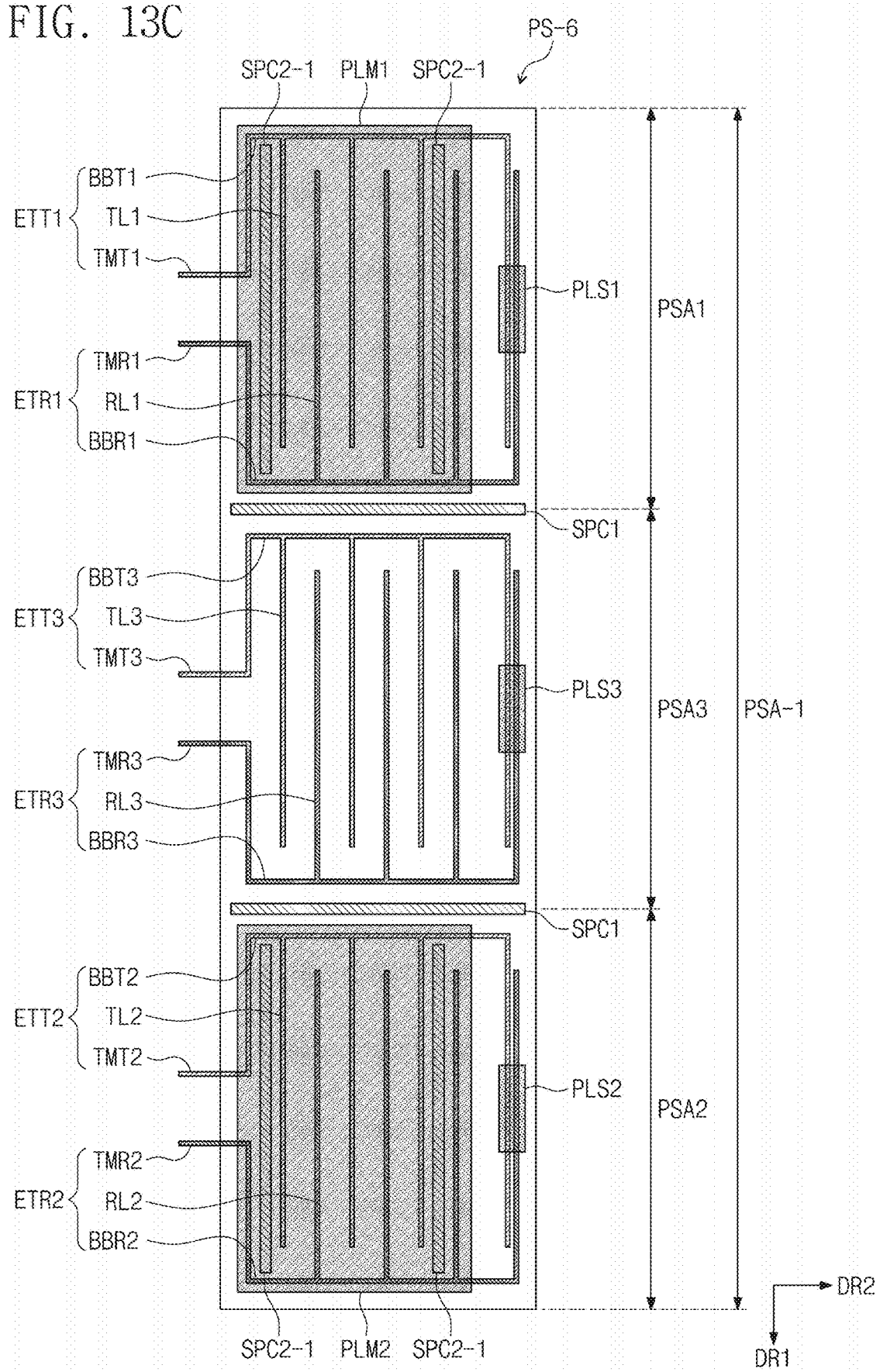

Referring to FIGS. 13B and 13C, the pressure sensing elements PS-5 and PS-6 may further include spacers SPC1, SPC2, and SPC2-1.

First spacers SPC1 may be disposed in the boundary areas between the first pressure sensing area PSA1 and the third pressure sensing area PSA3 and between the second pressure sensing area PSA2 and the third pressure sensing area PSA3.

Second spacers SPC2 and SPC2-1 may be disposed between the first transmitting lines TL1 and the first receiving lines RL1 and between the second transmitting lines TL2 and the second receiving lines RL2. In FIG. 13B, only one second spacer SPC2 is disposed in each of the first pressure sensing area PSA1 and the second pressure sensing area PSA2. In FIG. 13C, two second spacers SPC2-1 are disposed in each of the first pressure sensing area PSA1 and the second pressure sensing area PSA2. However, it is understood that any number of second spacers SPC2 and SPC2-1 may be disposed between adjacent first transmitting lines TL1 and the first receiving lines RL1 and between the second transmitting lines TL2 and the second receiving lines RL2 without deviating from the scope of the present disclosure.

Shapes, positions, and numbers of the spacers SPC, SPC1, SPC2, and SPC2-1 shown in FIGS. 13A to 13C may vary without deviating from the scope of the present disclosure.

Figure 14B:
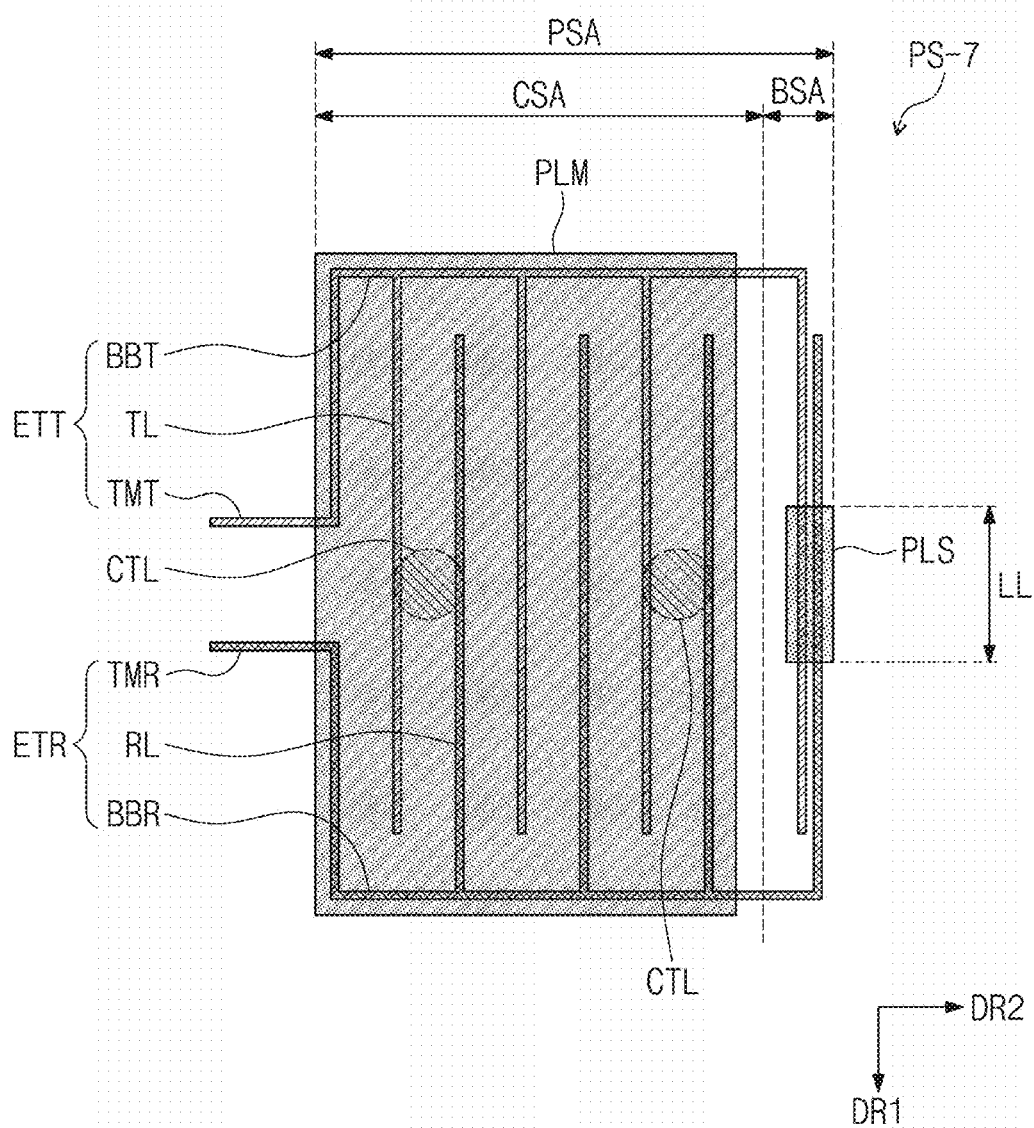
FIG. 14B is a plan view showing a portion of a pressure sensing element according to an exemplary embodiment of the present disclosure.

FIG. 14A is a cross-sectional view showing a portion of a pressure sensing element PS-7 according to an exemplary embodiment of the present disclosure. FIG. 14B is a plan view showing a portion of the pressure sensing element PS-7 according to an exemplary embodiment of the present disclosure.

The pressure sensing element PS-7 according to the exemplary embodiment of the present disclosure may include a coating layer CTL formed of a hydrophobic material. In detail, the coating layer CTL may include at least one of fluorine (F) and silicon (Si).

The coating layer CTL may be disposed on the transmitting electrode ETT and the receiving electrode ETR and may be disposed under the main pressure sensing layer PLM. The coating layer CTL may overlap at least portions of the transmitting lines TL and the receiving lines RL.

The coating layer CTL prevents portions of the transmitting electrode ETT and the receiving electrode ETR from making a contact with the main pressure sensing layer PLM and lowers a surface energy of the transmitting electrode ETT and the receiving electrode ETR. Accordingly, a gap between the first base SB1 and the second base SB2 may be maintained even in high-temperature or high-humidity environments. Although two portions of the coating layer CTL are show in FIGS. 14A and 14B, it is understood that any number of portions of the coating layer CTL may be used without deviating from the scope of the present disclosure. In addition, the shape of the coating layer CTL is not limited to a disc, and the coating layer CTL may have various other shapes without deviating from the scope of the present disclosure.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any particular embodiment described herein, and the scope of the present inventive concept shall be determined according to the attached claims.

What is claimed is:

1. A pressure sensing element comprising:
a first base;
a first transmitting electrode disposed on the first base and comprising a first transmitting terminal and a plurality of first transmitting lines electrically connected to the first transmitting terminal;
a first receiving electrode disposed on the first base and comprising a first receiving terminal and a plurality of first receiving lines alternately arranged with the plurality of first transmitting lines and electrically connected to the first receiving terminal;
a first main pressure sensing layer disposed on the first transmitting electrode and the first receiving electrode and spaced apart from the first transmitting electrode and the first receiving electrode by a first set distance;
a first sub-pressure sensing layer disposed on the first transmitting electrode and the first receiving electrode and making contact with the first transmitting electrode and the first receiving electrode without overlapping the first main pressure sensing layer when viewed in a plan view; and
a second base disposed on the first main pressure sensing layer and the first sub-pressure sensing layer, making contact with the first main pressure sensing layer, and spaced apart from the first sub-pressure sensing layer by a second set distance.

2. The pressure sensing element of claim 1, further comprising a sealing member that couples the first base and the second base.

3. The pressure sensing element of claim 2, wherein a first area of the first main pressure sensing layer is greater than a second area of the first sub-pressure sensing layer.

4. The pressure sensing element of claim 3, wherein at least one of the first main pressure sensing layer and the first sub-pressure sensing layer comprises a polymer resin and metal particles.

5. The pressure sensing element of claim 3, wherein a first number of the plurality of first transmitting lines is equal to a second number of the plurality of first receiving lines.

6. The pressure sensing element of claim 3, wherein the first main pressure sensing layer makes contact with at least a portion of the first transmitting electrode and the first receiving electrode when a pressure input is applied from an outside source through the second base.

7. The pressure sensing element of claim 3, wherein the first transmitting terminal and the first receiving terminal are disposed adjacent to a first side portion of the first main pressure sensing layer when viewed in the plan view, and the first sub-pressure sensing layer is disposed adjacent to a second side portion of the first main pressure sensing layer when viewed in the plan view.

8. The pressure sensing element of claim 3, further comprising a coating layer disposed on the first receiving electrode and the first transmitting electrode, disposed under the first main pressure sensing layer, overlapping at least portions of the plurality of first transmitting lines and the plurality of first receiving lines, wherein the coating layer comprises a hydrophobic material.

9. The pressure sensing element of claim 8, wherein the hydrophobic material comprises at least one of fluorine (F) and silicon (Si).

10. The pressure sensing element of claim 3, further comprising:
a second transmitting electrode disposed on the first base and comprising a second transmitting terminal and a plurality of second transmitting lines electrically connected to the second transmitting terminal;
a second receiving electrode disposed on the first base and comprising a second receiving terminal and a plurality of second receiving lines alternately arranged with the plurality of second transmitting lines and electrically connected to the second receiving terminal;
a second main pressure sensing layer disposed on the second transmitting electrode and the second receiving electrode and spaced apart from the second transmitting electrode and the second receiving electrode by the first set distance; and
a second sub-pressure sensing layer disposed on the second transmitting electrode and the second receiving electrode and making contact with the second transmitting electrode and the second receiving electrode without overlapping the second main pressure sensing layer.

11. The pressure sensing element of claim 10, wherein the second transmitting terminal and the second receiving terminal are disposed adjacent to a third side portion of the second main pressure sensing layer when viewed in the plan view, and the second sub-pressure sensing layer is disposed adjacent to a fourth side portion of the second main pressure sensing layer when viewed in the plan view.

12. The pressure sensing element of claim 10, wherein the second main pressure sensing layer makes contact with the second transmitting electrode and the second receiving electrode when a pressure input is applied from an outside source through the second base.

13. The pressure sensing element of claim 10, further comprising:
   a third transmitting electrode comprising a third transmitting terminal and a plurality of third transmitting lines electrically connected to the third transmitting terminal, disposed on the first base, and disposed between the first transmitting electrode and the second transmitting electrode when viewed in the plan view;
   a third receiving electrode comprising a third receiving terminal and a plurality of third receiving lines alternately arranged with the plurality of third transmitting lines and electrically connected to the third receiving terminal, disposed on the first base, and disposed between the first receiving electrode and the second receiving electrode when viewed in the plan view; and
   a third sub-pressure sensing layer disposed on the third transmitting electrode and the third receiving electrode, making contact with the third transmitting electrode and the third receiving electrode, and disposed between the first sub-pressure sensing layer and the second sub-pressure sensing layer when viewed in the plan view.

14. The pressure sensing element of claim 13, wherein the second main pressure sensing layer is not disposed between the third transmitting electrode and the second base, and between the third receiving electrode and the second base.

15. The pressure sensing element of claim 13, further comprising a plurality of spacers disposed between at least one of adjacent pairs of the plurality of first transmitting lines and the plurality of second transmitting lines and between at least one of adjacent pairs of the plurality of second transmitting lines and the plurality of third transmitting lines.

16. A display device comprising:
   a display panel comprising a plurality of light emitting elements;
   an input sensing circuit comprising a plurality of sensors disposed on the display panel and capacitively coupled to each other and an input sensing driver electrically connected to plurality of the sensors;
   a pressure sensing element disposed under the display panel; and
   a bracket disposed under the pressure sensing element,
   wherein the pressure sensing element comprises:
      a first base;
      a transmitting electrode disposed on the first base and comprising a transmitting terminal and a plurality of transmitting lines electrically connected to the transmitting terminal;
      a receiving electrode disposed on the first base and comprising a receiving terminal and a plurality of receiving lines alternately arranged with the plurality of transmitting lines and electrically connected to the receiving terminal;
      a main pressure sensing layer disposed on the transmitting electrode and the receiving electrode and spaced apart from the transmitting electrode and the receiving electrode by a first set distance;
      a sub-pressure sensing layer disposed on the transmitting electrode and the receiving electrode and making contact with the transmitting electrode and the receiving electrode without overlapping the main pressure sensing layer when viewed in a plan view; and
      a second base disposed on the main pressure sensing layer and the sub-pressure sensing layer, making contact with the main pressure sensing layer, and spaced apart from the sub-pressure sensing layer by a second set distance.

17. The display device of claim 16, wherein the transmitting terminal and the receiving terminal are electrically connected to the input sensing driver, and the input sensing driver measures a resistance value formed by the transmitting electrode, the receiving electrode, the main pressure sensing layer, and the sub-pressure sensing layer.

18. The display device of claim 16, wherein at least one of the main pressure sensing layer and the sub-pressure sensing layer comprises a polymer resin and metal particles.

19. The display device of claim 16, wherein the main pressure sensing layer makes contact with the transmitting electrode and the receiving electrode when a pressure is applied from an outside source through the second base.

20. The display device of claim 16, wherein the transmitting terminal and the receiving terminal are disposed adjacent to a first side portion of the main pressure sensing layer when viewed in the plan view, and the sub-pressure sensing layer is disposed adjacent to a second side portion of the main pressure sensing layer when viewed in the plan view.

* * * * *